US012813054B2

(12) United States Patent
Wang et al.

(10) Patent No.: US 12,813,054 B2
(45) Date of Patent: Nov. 24, 2026

(54) MULTI-COORDINATE SYSTEM CALIBRATION AND EQUIPMENT ALIGNMENT METHOD, AND MASS TRANSFER EQUIPMENT

(71) Applicant: BOE TECHNOLOGY GROUP CO., LTD., Beijing (CN)

(72) Inventors: Chengfei Wang, Beijing (CN); Junwei Yan, Beijing (CN); Zhonglin Chen, Beijing (CN); Ren Zhou, Beijing (CN); Jinxin An, Beijing (CN); Ze Ren, Beijing (CN); Guanghui Pei, Beijing (CN); Dajun Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 475 days.

(21) Appl. No.: 18/292,588

(22) PCT Filed: Nov. 2, 2022

(86) PCT No.: PCT/CN2022/129297

§ 371 (c)(1),
(2) Date: Jan. 26, 2024

(87) PCT Pub. No.: WO2024/092560

PCT Pub. Date: May 10, 2024

(65) Prior Publication Data

US 2025/0113682 A1 Apr. 3, 2025

(51) Int. Cl.

*H10H 29/03* (2025.01)
*H10P 72/50* (2026.01)

(Continued)

(52) U.S. Cl.

CPC ............. *H10H 29/03* (2025.01); *H10P 72/53* (2026.01); *H10P 74/203* (2026.01); *H10W 90/00* (2026.01)

(58) Field of Classification Search

CPC ........ H10H 29/03; H10H 29/24; H10P 72/53; H10P 74/203; H10P 72/50; H10W 90/00

See application file for complete search history.

(56) References Cited

U.S. PATENT DOCUMENTS

2020/0225277 A1* 7/2020 Kuo .................. G01R 1/07314
2022/0384225 A1* 12/2022 Motoyoshi .......... H10P 72/0446

* cited by examiner

*Primary Examiner* — Grace Q Li

(74) *Attorney, Agent, or Firm* — Dority & Manning, P.A.

(57) ABSTRACT

A multi-coordinate system calibration and equipment alignment method includes: determining a first mapping relationship between a first image pixel coordinate system of an intermediate carrier substrate carrying stage and a world coordinate system; determining a second mapping relationship between a second image pixel coordinate system of a backplane carrying stage and the world coordinate system; determining galvanometer start point coordinates in the world coordinate system; obtaining first template calibration coordinates in the world coordinate system by using the first mapping relationship and the galvanometer start point coordinates; obtaining second template calibration coordinates in the world coordinate system by using the second mapping relationship and the galvanometer start point coordinates; aligning the intermediate carrier substrate based on actual coordinates of the intermediate carrier substrate carrying stage and the first template calibration coordinates; and aligning the backplane based on actual coordinates of the backplane carrying stage and the second template calibration coordinates.

20 Claims, 19 Drawing Sheets

(51) Int. Cl.
*H10P 74/20* (2026.01)
*H10W 90/00* (2026.01)

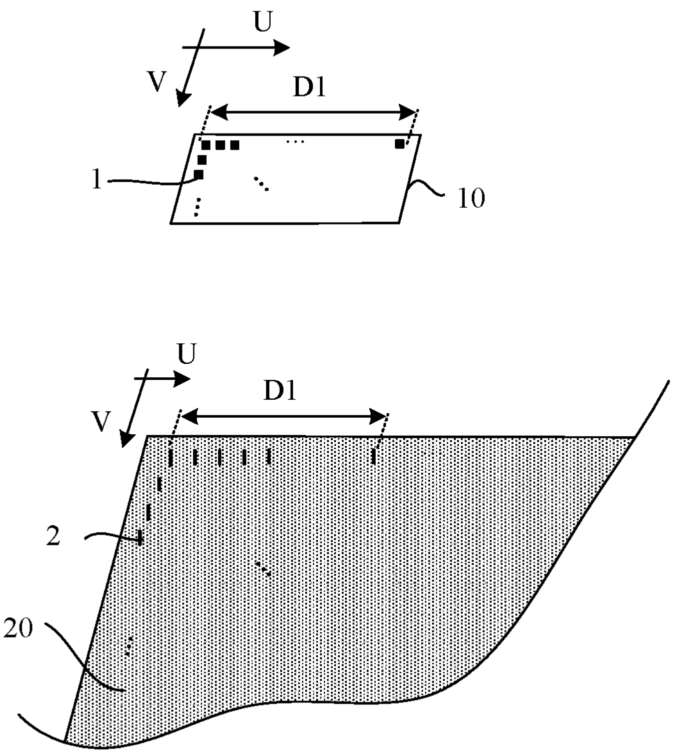

FIG. 24

After an intermediate carrier substrate in a first row and an (n-1)th column is transferred, the number of transferred light-emitting diodes is recorded, and fifth position deviation coordinates of the position of the start point of the intermediate carrier substrate in the first row and an nth column and the position of the start point of the intermediate carrier substrate in the first row and the (n-1)th column are obtained (5-5)

↓

The backplane carrying stage is run to a position of a sum of the fourth coordinates, the third position deviation coordinates and the fifth position deviation coordinates, the second fine alignment camera acquires the image of the eighth feature point, and the fourth position deviation coordinates of the image of the eighth feature point and the image of the fourth feature point are obtained (5-6)

↓

The backplane carrying stage is run to the position of the sum of the fifth coordinates and the fourth position deviation coordinates, so that the alignment of the backplane is completed (5-7)

FIG. 25

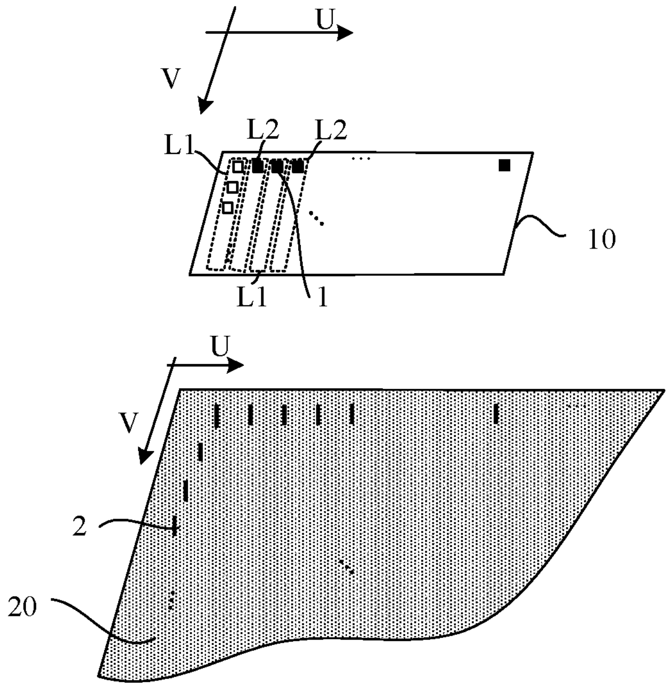

FIG. 28

After the intermediate substrate in the first row and the first column is transferred, the number of transferred light-emitting diodes is recorded, the fifth position deviation coordinates of the coordinates of the position of the start point of the intermediate carrier substrate in the first row and the second column and the position of the start point of the intermediate carrier substrate in the first row and the first column are obtained, and the six position deviation coordinates of the start position of the to-be transferred column of light-emitting diodes on the intermediate carrier substrate and the start position of the transferred column of light-emitting diodes on the intermediate carrier substrate are obtained (6-5)'

↓

The backplane carrying stage is run to the position of the sum of the fourth coordinates, the third position deviation coordinates and the fifth position deviation coordinates, the second fine alignment camera acquires the image of the eighth feature point, and the fourth position deviation coordinates of the image of the eighth feature point and the image of the fourth feature point are obtained (6-6)'

↓

The backplane carrying stage is run to the position of the sum of the fifth coordinates, the fourth position deviation coordinates and the sixth position deviation coordinates, so that the alignment of the backplane is completed (6-7)'

FIG. 29

MULTI-COORDINATE SYSTEM CALIBRATION AND EQUIPMENT ALIGNMENT METHOD, AND MASS TRANSFER EQUIPMENT

CROSS-REFERENCE TO RELATED APPLICATION

This application is a national phase entry under 35 USC 371 of International Patent Application No. PCT/CN2022/129297, filed on Nov. 2, 2022, which is incorporated herein by reference in its entirety.

TECHNICAL FIELD

The present disclosure relates to the field of display technologies, and in particular, to a multi-coordinate system calibration and equipment alignment method, a non-transitory computer-readable storage medium, and a mass transfer equipment.

BACKGROUND

At present, with the development of semiconductor display technologies, mini light-emitting diode (Mini-LED) chips and micro light-emitting diode (Micro-LED) chips have wide applied markets. A large number of small-sized Mini-LED chips or Micro-LED chips are assembled on the display backplane, which is conducive to improving the display performance of the display device and bringing people a good visual experience.

SUMMARY

A multi-coordinate system calibration and equipment alignment method is provided. The multi-coordinate system calibration and equipment alignment method includes: determining a first mapping relationship between a first image pixel coordinate system of an intermediate carrier substrate carrying stage and a world coordinate system by performing a vision hand-eye calibration on the intermediate carrier substrate carrying stage; determining a second mapping relationship between a second image pixel coordinate system of a backplane carrying stage and the world coordinate system by performing the vision hand-eye calibration on the backplane carrying stage; determining galvanometer start point coordinates of a start point of a galvanometer of a laser in the world coordinate system; obtaining first template calibration coordinates of an intermediate carrier substrate in the world coordinate system by using the first mapping relationship and the galvanometer start point coordinates; obtaining second template calibration coordinates of a backplane in the world coordinate system by using the second mapping relationship and the galvanometer start point coordinates; aligning the intermediate carrier substrate based on actual coordinates of the intermediate carrier substrate carrying stage and the first template calibration coordinates during a mass transfer process; and aligning the backplane based on actual coordinates of the backplane carrying stage and the second template calibration coordinates during the mass transfer process.

In some embodiments, the step of determining the first mapping relationship between the first image pixel coordinate system of the intermediate carrier substrate carrying stage and the world coordinate system by performing the vision hand-eye calibration on the intermediate carrier substrate carrying stage includes steps (1-1) to (1-3). In step (1-1), a first target object is placed on the intermediate carrier substrate carrying stage, and a camera of the intermediate carrier substrate carrying stage acquires a first image. The first image includes the first target object and the first image pixel coordinate system. In step (1-2), a fourth mapping relationship between a first camera coordinate system of the intermediate carrier substrate carrying stage and the first image pixel coordinate system is established through intrinsic parameters of the camera of the intermediate carrier substrate carrying stage; and a fifth mapping relationship between the first camera coordinate system of the intermediate carrier substrate carrying stage and the world coordinate system is established through extrinsic parameters of the camera of the intermediate carrier substrate carrying stage. In step (1-3), the first mapping relationship between the first image pixel coordinate system and the world coordinate system is determined based on the fourth mapping relationship and the fifth mapping relationship.

In some embodiments, the camera of the intermediate carrier substrate carrying stage includes: a first rough alignment camera and a first fine alignment camera; the first rough alignment camera is used to acquire a first sub-image, and the first sub-image includes a first sub-image pixel coordinate system; the first fine alignment camera is used to acquire a second sub-image, and the second sub-image includes a second sub-image pixel coordinate system; the first image pixel coordinate system includes the first sub-image pixel coordinate system and the second sub-image pixel coordinate system.

The step of determining the first mapping relationship between the first image pixel coordinate system of the intermediate carrier substrate carrying stage and the world coordinate system includes: determining a first sub-mapping relationship between the first sub-image pixel coordinate system and the world coordinate system; determining a second sub-mapping relationship between the second sub-image pixel coordinate system and the world coordinate system; and determining the first mapping relationship based on the first sub-mapping relationship and the second sub-mapping relationship.

In some embodiments, the step of determining the second mapping relationship between the second image pixel coordinate system of the backplane carrying stage and the world coordinate system by performing the vision hand-eye calibration on the backplane carrying stage includes steps (1-4) to (1-6). In step (1-4), a second target object is placed on the backplane carrying stage, and a camera of the backplane carrying stage acquires a second image. The second image includes the second target object and the second image pixel coordinate system. In step (1-5), a sixth mapping relationship between a second camera coordinate system of the backplane carrying stage and the second image pixel coordinate system is established through intrinsic parameters of the camera of the backplane carrying stage; and a seventh mapping relationship between the second camera coordinate system of the backplane carrying stage and the world coordinate system is established through extrinsic parameters of the camera of the backplane carrying stage. In step (1-6), the second mapping relationship between the second image pixel coordinate system and the world coordinate system is determined based on the sixth mapping relationship and the seventh mapping relationship.

In some embodiments, the first target object and the second target object each include a vision calibration board.

In some embodiments, the camera of the backplane carrying stage includes a second rough alignment camera and a second fine alignment camera; the second rough alignment camera is used to acquire a third sub-image, and the third sub-image includes a third sub-image pixel coordinate system; the second fine alignment camera is used to acquire a fourth sub-image, and the fourth sub-image includes a fourth sub-image pixel coordinate system; the second image pixel coordinate system includes: the third sub-image pixel coordinate system and the fourth sub-image pixel coordinate system.

The step of determining the second mapping relationship between the second image pixel coordinate system of the backplane carrying stage and the world coordinate system includes: determining a third sub-mapping relationship between the third sub-image pixel coordinate system and the world coordinate system; determining a fourth sub-mapping relationship between the fourth sub-image pixel coordinate system and the world coordinate system; and determining the second mapping relationship based on the third sub-mapping relationship and the fourth sub-mapping relationship.

In some embodiments, the step of determining the galvanometer start point coordinates of the start point of the galvanometer of the laser in the world coordinate system includes steps (2-1) to (2-4). In step (2-1), a laser spot working area of a galvanometer is determined. In step (2-2), the backplane carrying stage with a recognition point is run directly below the laser spot working area of the galvanometer, and the laser outputs a light spot at coordinates of the start point of the galvanometer. In step (2-3), the backplane carrying stage is run into a field of view of the second fine alignment camera. In step (2-4), according to a data conversion of intrinsic parameters and extrinsic parameters of the second fine alignment camera, a coordinate offset between a center of the recognition point and a center of the light spot at the coordinates of the start point of the galvanometer is obtained, and the galvanometer start point coordinates of the start point of the galvanometer in the world coordinate system are determined.

In some embodiments, a determining method for the step (2-3) of running the backplane carrying stage into the field of view of the second fine alignment camera includes: if the recognition point of the backplane carrying stage and the light spot at the coordinates of the start point of the galvanometer appear simultaneously within the field of view of the second fine alignment camera, determining that the backplane carrying is run into the field of view of the second fine alignment camera; and if the recognition point of the backplane carrying stage and the light spot at the coordinates of the start point of the galvanometer do not appear simultaneously within the field of view of the second fine alignment camera, returning to the step (2-2).

In some embodiments, the step of obtaining the first template calibration coordinates of the intermediate carrier substrate in the world coordinate system by using the first mapping relationship and the galvanometer start point coordinates includes steps (3-1) to (3-4). In step (3-1), the intermediate carrier substrate is placed on the intermediate carrier substrate carrying stage. The intermediate carrier substrate is provided with a plurality of light-emitting diodes that are arranged in an array. In step (3-2), the intermediate carrier substrate carrying stage is run directly below a field of view of the first rough alignment camera, an image of a first feature point is acquired, and first coordinates of the intermediate carrier substrate carrying stage in the word coordinate system are determined by using the first mapping relationship and coordinates of the first feature point in the first image pixel coordinate system. In step (3-3), the intermediate carrier substrate carrying stage is run to a position where coordinates of a light-emitting diode at a start point of the intermediate carrier substrate coincide with the galvanometer start point coordinates, the first fine alignment camera acquires an image of a second feature point, and second coordinates of the intermediate carrier substrate carrying stage in the word coordinate system are determined by using the first mapping relationship and coordinates of the second feature point in the first image pixel coordinate system. In step (3-4), the first template calibration coordinates of the intermediate carrier substrate in the world coordinate system are obtained based on the first coordinates and the second coordinates.

In some embodiments, the step of aligning the intermediate carrier substrate based on actual coordinates of the intermediate carrier substrate carrying stage and the first template calibration coordinates during a mass transfer process includes steps (4-1) to (4-4). In step (4-1), the intermediate carrier substrate is placed on the intermediate carrier substrate carrying stage. In step (4-2), the intermediate carrier substrate carrying stage is run to a position of the first coordinates, an image of a fifth feature point is acquired, and first position deviation coordinates of the image of the fifth feature point and the image of the first feature point are obtained. In step (4-3), the intermediate carrier substrate carrying stage is run to a position of a sum of the second coordinates and the first position deviation coordinates, the first fine alignment camera acquires an image of a sixth feature point, and second position deviation coordinates of the image of the sixth feature point and the image of the second feature point are obtained. In step (4-4), the intermediate carrier substrate carrying stage is run to a position of the second position deviation coordinates, so that the alignment of the intermediate carrier substrate is completed.

In some embodiments, the step of obtaining the second template calibration coordinates of the backplane in the world coordinate system by using the second mapping relationship and the galvanometer start point coordinates includes steps (3-5) to (3-9). In step (3-5), the backplane is placed on the backplane carrying stage. The backplane is provided with a plurality of pads that are arranged in an array. In step (3-6), the backplane carrying stage is run directly below a field of view of the second rough alignment camera, an image of a third feature point is acquired, and third coordinates of the backplane carrying stage in the world coordinate system are determined by using the second mapping relationship and coordinates of the third feature point in the second image pixel coordinate system. In step (3-7), the backplane carrying stage is run directly below the field of view of the second fine alignment camera, an image of a fourth feature point is acquired, and fourth coordinates of the backplane carrying stage in the world coordinate system are determined by using the second mapping relationship and coordinates of the fourth feature point in the second image pixel coordinate system. In step (3-8), the backplane carrying stage is run to a position where coordinates of a pad at a start point of the backplane coincide with the galvanometer start point coordinates, and fifth coordinates of the backplane carrying stage in the world coordinate system are recorded. In step (3-9), the second template calibration coordinates of the backplane in the world coordinate system are obtained based on the third coordinates, the fourth coordinates and the fifth coordinates.

In some embodiments, the step of aligning the backplane based on the actual coordinates of the backplane carrying stage and the second template calibration coordinates during the mass transfer process includes steps (4-5) to (4-8). In step (4-5), the backplane is placed on the backplane carrying stage. In step (4-6), the backplane carrying stage is run to a position of the third coordinates, an image of a seventh feature point is acquired, and third position deviation coordinates of the image of the seventh feature point and the image of the third feature point are obtained. In step (4-7), the backplane carrying stage is run to a position of a sum of the fourth coordinates and the third position deviation coordinates, the second fine alignment camera acquiring an image of an eighth feature point, and fourth position deviation coordinates of the image of the eighth feature point and the image of the fourth feature point are obtained. In step (4-8), the backplane carrying stage is run to a position of a sum of the fifth coordinates and the fourth position deviation coordinates, so that the alignment of the backplane is completed.

In some embodiments, in a first direction, under a standard size, a ratio of a number of the light-emitting diodes on the intermediate carrier substrate to a number of the pads on the backplane is T:1. The standard size is a size occupied by a row of light-emitting diodes arranged in the first direction, and T is a positive integer greater than or equal to 1.

In some embodiments, when T is equal to 1, the step of aligning the backplane based on the actual coordinates of the backplane carrying stage and the second template calibration coordinates during the mass transfer process includes: aligning the backplane after an intermediate carrier substrate in a first row and an nth column is aligned, n being a positive integer greater than or equal to 2, including steps (5-5) to (5-7). In step (5-5), after an intermediate carrier substrate in the first row and an (n−1)th column is transferred, a number of transferred light-emitting diodes is recorded, and fifth position deviation coordinates of coordinates of a position of a start point of the intermediate carrier substrate in the first row and the nth column and a position of a start point of the intermediate carrier substrate in the first row and the (n−1)th column are obtained. In step (5-6), the backplane carrying stage is run to a position of a sum of the fourth coordinates, the third position deviation coordinates and the fifth position deviation coordinates, the second fine alignment camera acquires an image of an eighth feature point, and fourth position deviation coordinates of the image of the eighth feature point and the image of the fourth feature point are obtained. In step (5-7), the backplane carrying stage is run to a position of a sum of the fifth coordinates and the fourth position deviation coordinates, so that the alignment of the backplane is completed.

In some embodiments, when T is greater than 1, the step of aligning the backplane based on the actual coordinates of the backplane carrying stage and the second template calibration coordinates during the mass transfer process includes: aligning the backplane after an intermediate carrier substrate in a first row and an nth column is aligned, n being a positive integer greater than or equal to 2, including steps (6-5) to (6-7). In step (6-5), after an intermediate carrier substrate in the first row and an (n−1)th column is transferred, a number of transferred light-emitting diodes is recorded, fifth position deviation coordinates of a position of a start point of the intermediate carrier substrate in the first row and the nth column and a position of a start point of the intermediate carrier substrate in the first row and the (n−1)th column are obtained, and sixth position deviation coordinates of a start position of a to-be-transferred column of light-emitting diodes of the intermediate carrier substrate in the first row and the nth column and a start position of a transferred column of light-emitting diodes are obtained. In step (6-6), the backplane carrying stage is run to a position of a sum of the fourth coordinates, the third position deviation coordinates and the fifth position deviation coordinates, the second fine alignment camera acquiring an image of an eighth feature point, and fourth position deviation coordinates of the image of the eighth feature point and the image of the fourth feature point are obtained. In step (6-7), the backplane carrying stage is run to a position of a sum of the fifth coordinates, the fourth position deviation coordinates and the sixth position deviation coordinates, so that the alignment of the backplane is completed.

In some embodiments, when T is equal to 1, the step of aligning the backplane based on the actual coordinates of the backplane carrying stage and the second template calibration coordinates during the mass transfer process includes: aligning the backplane after an intermediate carrier substrate in an mth row and a first column is aligned, m being a positive integer greater than or equal to 2, including steps (7-5) to (7-7). In step (7-5), after an intermediate carrier substrate in an (m−1)th row and the first column is transferred, a number of transferred light-emitting diodes is recorded, and seventh position deviation coordinates of a position of a start point of the intermediate carrier substrate in the mth row and the first column and a position of a start point of the intermediate carrier substrate in the (m−1) the row and the first column are obtained. In step (7-6), the backplane carrying stage is run to a position of a sum of the fourth coordinates, the third position deviation coordinates and the seventh position deviation coordinates, the second fine alignment camera acquires an image of an eighth feature point, and fourth position deviation coordinates of the image of the eighth feature point and the image of the fourth feature point are determined. In step (7-7), the backplane carrying stage is run to a position of a sum of the fifth coordinates and the fourth position deviation coordinates, so that the alignment of backplane is completed.

In some embodiments, when T is greater than 1, the step of aligning the backplane based on the actual coordinates of the backplane carrying stage and the second template calibration coordinates during the mass transfer process includes: aligning the backplane after an intermediate carrier substrate in an mth row and a first column is aligned, m being a positive integer greater than or equal to 2, including steps (8-5) to (8-7). In step (8-5), after an intermediate carrier substrate in an (m−1)th row and the first column is transferred, a number of transferred light-emitting diodes is recorded, seventh position deviation coordinates of a position of a start point of the intermediate carrier substrate in the mth row and the first column and a position of a start point of the intermediate carrier substrate in the (m−1) the row and the first column are obtained, and sixth position deviation coordinates of a start position of a to-be-transferred column of light-emitting diodes of the intermediate carrier substrate in the mth row and the first column and a start position of a transferred column of light-emitting diodes are obtained. In step (8-6), the backplane carrying stage is run to a position of a sum of the fourth coordinates, the third position deviation coordinates and the fifth position deviation coordinates, the second fine alignment camera acquires an image of an eighth feature point, and fourth position deviation coordinates of the image of the eighth feature point and the image of the fourth feature point are obtained. In step (8-7), the backplane carrying stage is run to a position of a sum of the fifth coordinates, the fourth position deviation coordinates and the sixth position deviation coordinates, so that the alignment of the backplane is completed.

A non-transitory computer-readable storage medium is provided. The non-transitory computer-readable storage medium has stored computer instructions. The computer instructions are used to cause a computer to perform the multi-coordinate system calibration and equipment alignment method as described in any of the above embodiments.

In yet another aspect, a mass transfer equipment is provided, which includes a memory, an intermediate carrier substrate, an intermediate carrier substrate carrying stage, a camera of the an intermediate carrier substrate carrying stage, a backplane, a backplane carrying stage, a camera of the backplane carrying stage, a laser, a processor, and a computer program stored in the memory and executable on the processor. The processor executes the program to implement the multi-coordinate system calibration and equipment alignment method as described in any of the above embodiments.

BRIEF DESCRIPTION OF THE DRAWINGS

In order to describe technical solutions in some embodiments of the present disclosure more clearly, the accompanying drawings to be used in some embodiments of the present disclosure will be introduced briefly. However, the accompanying drawings to be described below are merely some embodiments of the present disclosure, and a person of ordinary skill in the art can obtain other drawings according to those drawings. In addition, accompanying drawings in the following description may be regarded as schematic diagrams, and are not limitations on actual sizes of products, actual processes of methods and actual timings of signals involved in the embodiments of the present disclosure.

FIG. 24 is a structural diagram of an intermediate carrier substrate and a backplane, in accordance with yet some other embodiments of the present disclosure;

FIG. 25 is a flow diagram of a backplane calibration, in accordance with some other embodiments of the present disclosure;

FIG. 28 is a structural diagram of an intermediate carrier substrate and a backplane, in accordance with yet some other embodiments of the present disclosure;

FIG. 29 is a flow diagram of a backplane calibration, in accordance with yet some other embodiments of the present disclosure;

DETAILED DESCRIPTION

Figure 1:
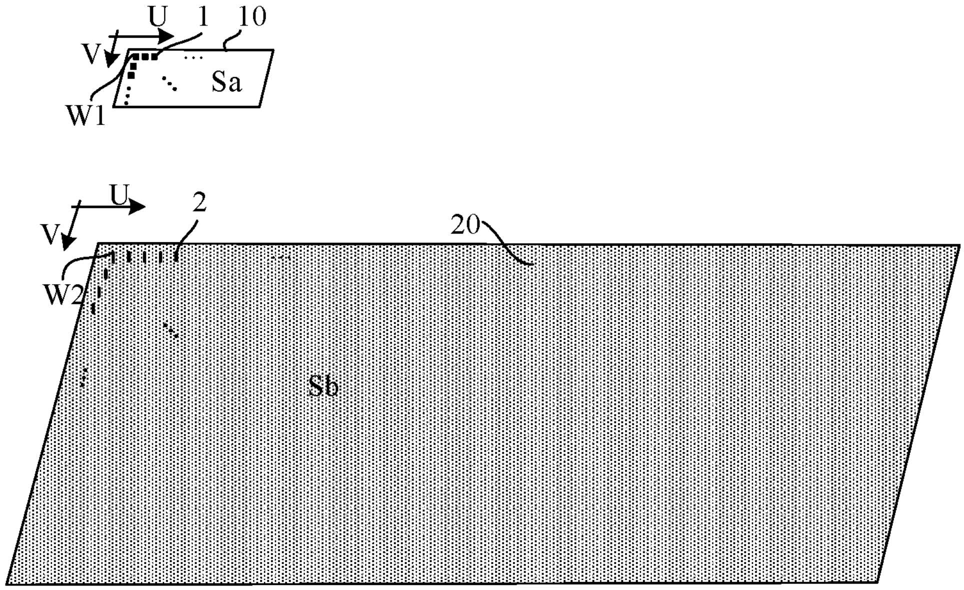
FIG. 1 is a structural diagram of an intermediate carrier substrate and a backplane, in accordance with some embodiments of the present disclosure.

The technical solutions in some embodiments of the present disclosure will be described clearly and completely with reference to the accompanying drawings. However, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, the term such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, features defined with "first" and "second" may explicitly or implicitly include one or more of the features. In the description of the embodiments of the present disclosure, the terms "a plurality of", "the plurality of" and "multiple" each mean two or more unless otherwise specified.

Some embodiments may be described using the expressions "coupled" and "connected" along with their derivatives. The term "connected" or "connection" should be understood in a broad sense. For example, the term "connected" or "connection" may be a fixed connection, a detachable connection, or an integral connection; it may be a direct connection, or an indirect connection through an intermediate medium. The term "coupled", for example, indicates that two or more components are in direct physical or electrical contact. The term "coupled" or "communicatively coupled" may also indicate that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of "applicable to" or "configured to" herein means an open and inclusive expression, which does not exclude devices that are applicable to or configured to perform additional tasks or steps.

In addition, the phrase "based on" as used herein is meant to be open and inclusive, since a process, step, calculation or other action that is "based on" one or more of the stated conditions or values may, in practice, be based on additional conditions or value beyond those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

As used herein, the term such as "parallel", "perpendicular" or "equal" includes a stated condition and a condition similar to the stated condition, a range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intermediate layer(s) exist between the layer or element and the another layer or substrate.

Exemplary embodiments are described herein with reference to sectional views and/or plan views as idealized exemplary drawings. In the drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region that is shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

In general, mini light-emitting diodes (Mini-LEDs) have the size of about 100 μm to 300 μm, and micro light-emitting diodes (Micro-LEDs) have the size of about less than 100 μm. Micro-LEDs and Mini-LEDs are regarded as next-generation display technologies after liquid crystal displays (LCDs) and organic light-emitting diodes (OLEDs) due to their low power consumption, fast response, long life, and high light efficiency.

Compared with the traditional small-pitch light-emitting diodes (LEDs), the pitch of Micro-LEDs and Mini-LEDs is smaller, which significantly improves the display resolution and image quality, the optical angle may make the viewing angle wide, the contrast ratio is high, and the picture quality is good. Due to the micron-level pixel pitch, it may be possible to cover multiple application scenarios from small and medium-sized displays to large and medium-sized displays. It is suitable for a variety of display scenarios such as virtual reality, small projectors, micro-displays, visible light communication, and medical research.

However, as shown in FIG. 1, a plurality of light-emitting diodes 1 are arranged in an array on an intermediate carrier substrate 10. During a transfer process of the light-emitting diodes 1, the light-emitting diodes 1 on the intermediate carrier substrate 10 need to be transferred to pads 2 of a backplane 20. However, due to the extremely small size of the intermediate carrier substrate 10 and the large number of light-emitting diodes 1 for each transfer, the accuracy and speed requirements for the transfer process are very high, which has become a key technology restricting the mass production of Micro-LEDs and Mini-LEDs.

For example, as shown in FIG. 1, a ratio of a size of the intermediate carrier substrate 10 to a size of the backplane 20 is 1:30. For example, the intermediate carrier substrate 10 and the backplane 20 are each in a shape of a square, an area of the intermediate carrier substrate 10 is Sa, an area of the backplane 20 is Sb, and a ratio of the area Sa to the area Sb is 1:30. The ratio of the sizes indicates that if the transfer of the light-emitting diodes 1 on the backplane 20 is realized, the intermediate carrier substrate 10 and the backplane 20 need to be aligned 30 times.

For example, the intermediate carrier substrate 10 includes a plurality of light-emitting diodes 1 arranged in an array along a first direction U and a second direction V. The first direction U is a row direction in which the plurality of light-emitting diodes 1 are arranged, and the second direction V is a column direction in which the plurality of light-emitting diodes 1 are arranged. The backplane 20 includes a plurality of pads 2 arranged in an array along the first direction U and the second direction V. The first direction U is a row direction in which the plurality of pads 2 are arranged, and the second direction V is a column direction in which the plurality of pads 2 are arranged.

It should be noted that pads 2 in FIG. 1 may be a pad group, and the pads 2 in the figures only illustrate positions of the pads 2, and structures of the pads will not be limited.

Based on this, embodiments of the present disclosure provide a multi-coordinate system calibration and equipment alignment method. This multi-coordinate system calibration and equipment alignment method may be applied to Micro-LEDs, Mini-LEDs, and micro-components similar sizes to Micro-LEDs and Mini-LEDs such as micro integrated circuits (ICs), which will not be limited here.

Figure 2:
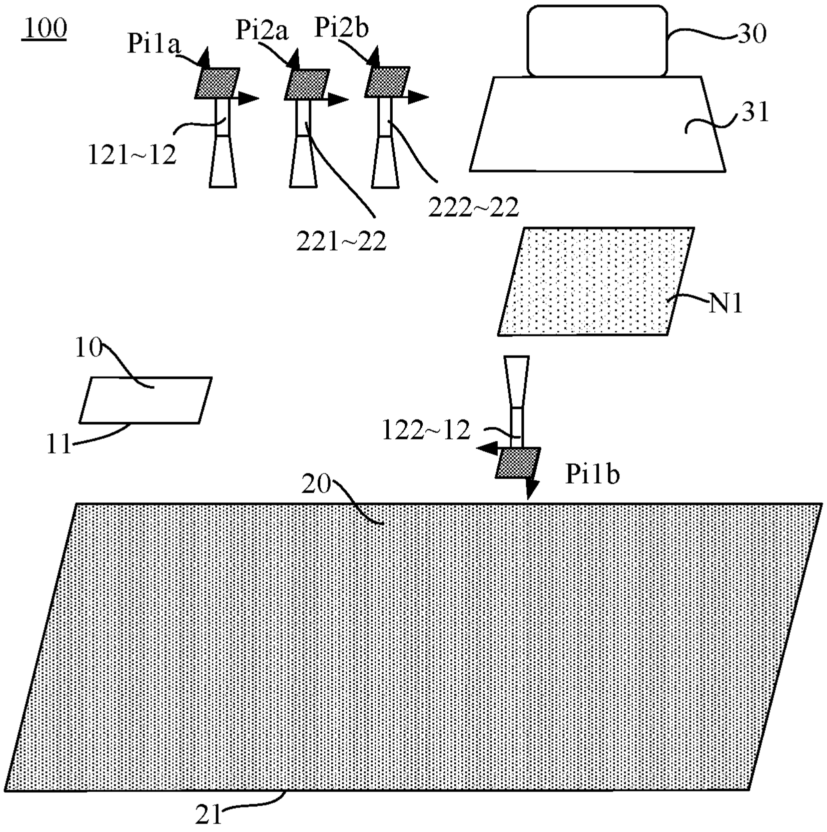
FIG. 2 is a structural diagram of a use system for a multi-coordinate system calibration and equipment alignment method, in accordance with some embodiments of the present disclosure.

In order to facilitate the understanding of the specific implementation process of the above multi-coordinate system calibration and equipment alignment method, an exemplary application system 100 for the multi-coordinate system calibration and equipment alignment method is firstly introduced. As shown in FIG. 2, the application system 100 includes: an intermediate carrier substrate 10, an intermediate carrier substrate carrying stage 11, a camera 12 of the intermediate carrier substrate carrying stage 11, a backplane 20, a backplane carrying stage 21, a camera 22 of the backplane carrying stage 21, and a galvanometer 30 and a field mirror 31 of a laser (not shown in the figure).

The intermediate carrier substrate 10 may be placed on the intermediate carrier substrate carrying stage 11, the intermediate carrier substrate carrying stage 11 is used to transport the intermediate carrier substrate 10, and the camera 12 of the intermediate carrier substrate carrying stage 11 is used to capture images. The backplane 20 may be placed on the backplane carrying stage 21, the backplane carrying stage 21 is used to transport the backplane 20, and the camera 22 of the backplane carrying stage 21 is used to capture images. The galvanometer 30 may also be referred to as a laser scanner, and the field mirror 31 is a focusing mirror. The light spot working area N1 that meets the process requirements may be determined through selection and cooperation of the galvanometer 30 and the field mirror 31. After the intermediate carrier substrate 10 and the backplane 20 are aligned, when the light spot irradiates the light-emitting diodes 1 on the intermediate carrier substrate 10, the light-emitting diodes 1 and the intermediate carrier substrate 10 may be dissociated, so that the light-emitting diodes 1 are connected to corresponding pads on the backplane 20, which realizes the transfer operation of the light-emitting diodes 1 on the backplane 20.

It should be noted that the intermediate carrier substrate 10 may be superposed on the intermediate carrier substrate carrying stage 11, and the intermediate carrier substrate 10 and the intermediate carrier substrate carrying stage 11 in FIG. 2 are represented by the same pattern. The backplane 20 may be superposed on the backplane carrying stage 21, and the backplane 20 and the backplane carrying stage 21 in FIG. 2 are represented by the same pattern.

Figure 3:
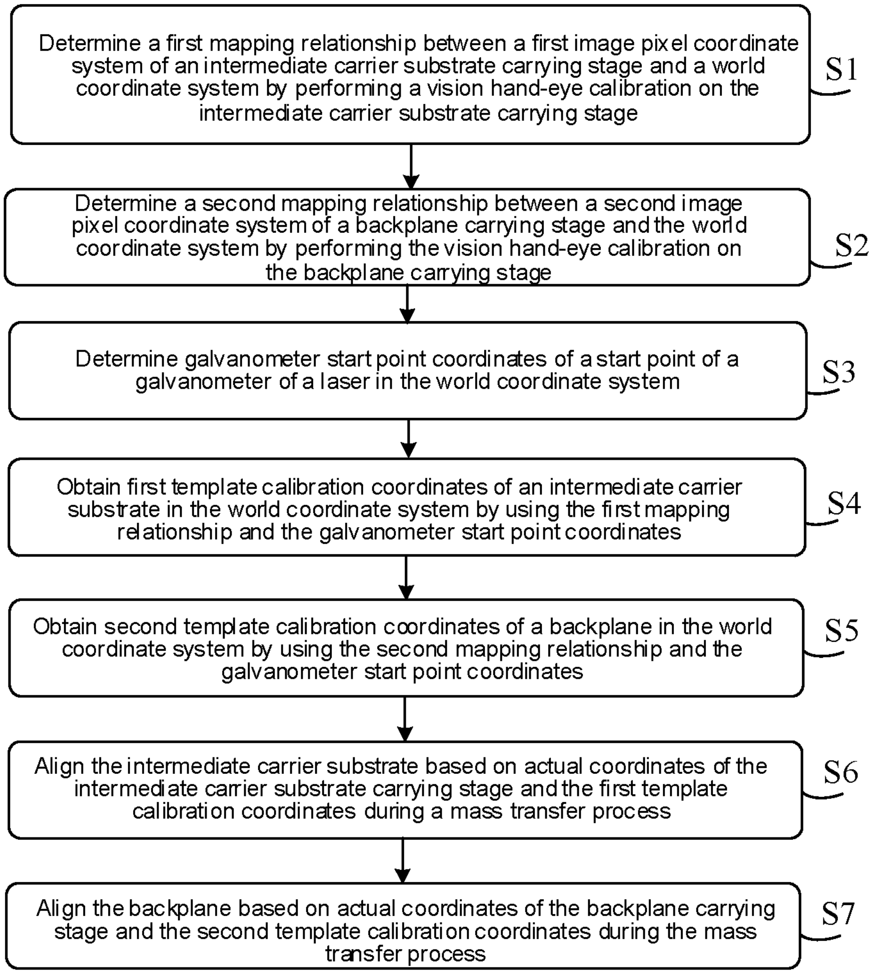
FIG. 3 is a flow diagram of a multi-coordinate system calibration and equipment alignment method, in accordance with some embodiments of the present disclosure.

In some embodiments, as shown in FIG. 3, the multi-coordinate system calibration and equipment alignment method includes the following steps S1 to S7.

It should be noted that S1 to S7 are only used to identify the steps and are not limitation on the order of the steps.

Figure 4:
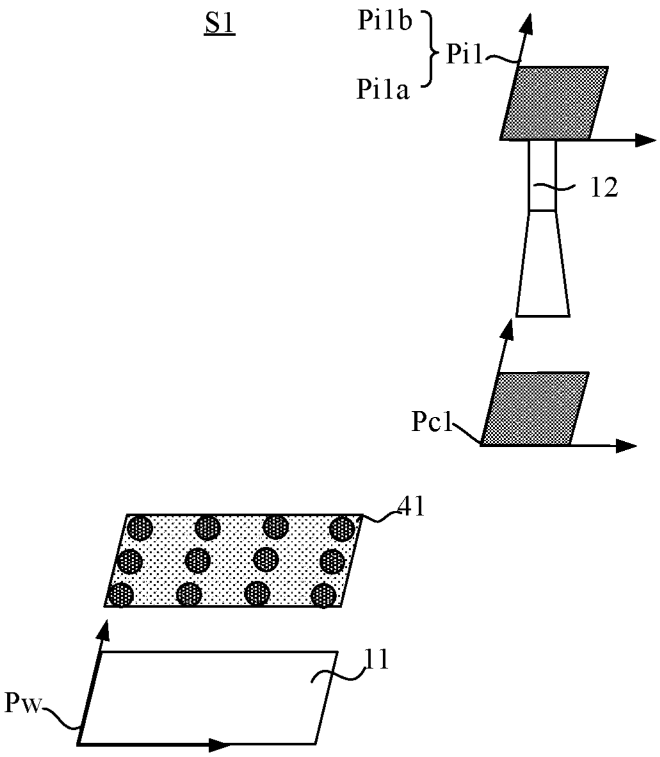
FIG. 4 is a diagram showing a step of a vision hand-eye calibration of an intermediate carrier substrate carrying stage, in accordance with some embodiments of the present disclosure.

In S1, as shown in FIG. 4, a first mapping relationship between a first image pixel coordinate system Pi1 of the intermediate carrier substrate carrying stage 11 and a world coordinate system Pw is determined by performing a vision hand-eye calibration on the intermediate carrier substrate carrying stage 11.

For example, the vision hand-eye calibration is mainly to obtain a coordinate conversion relationship between the camera 12 and a moving component (e.g., the intermediate carrier substrate carrying stage 11). Therefore, coordinates in the first image pixel coordinate system Pi1 in vision are represented in the world coordinate system Pw.

For example, when one target point (e.g., a recognition point) needs to be placed at the same target position twice, in order to make a position where the target point is placed for the second time accurately coincide with a target position where the target point is placed for the first time, the camera 12 may capture images after the target point that is placed twice, image pixel coordinates of the target point in the two captured images are converted into coordinates in the world coordinate system Pw through the first mapping relationship between the first image pixel coordinate system Pi1 and the world coordinate system Pw, an offset difference between the two coordinates is calculated, and the position is adjusted. Thus, it may be possible to realize that the target point is accurately placed at the same target position twice.

The first mapping relationship between the first image pixel coordinate system Pi1 of the intermediate carrier substrate carrying stage 11 and the world coordinate system Pw is established through the step S1, so that the coordinates in the image captured by the camera 12 of the intermediate carrier substrate carrying stage 11 may be converted to the coordinates in the world coordinate system Pw.

Figure 5:
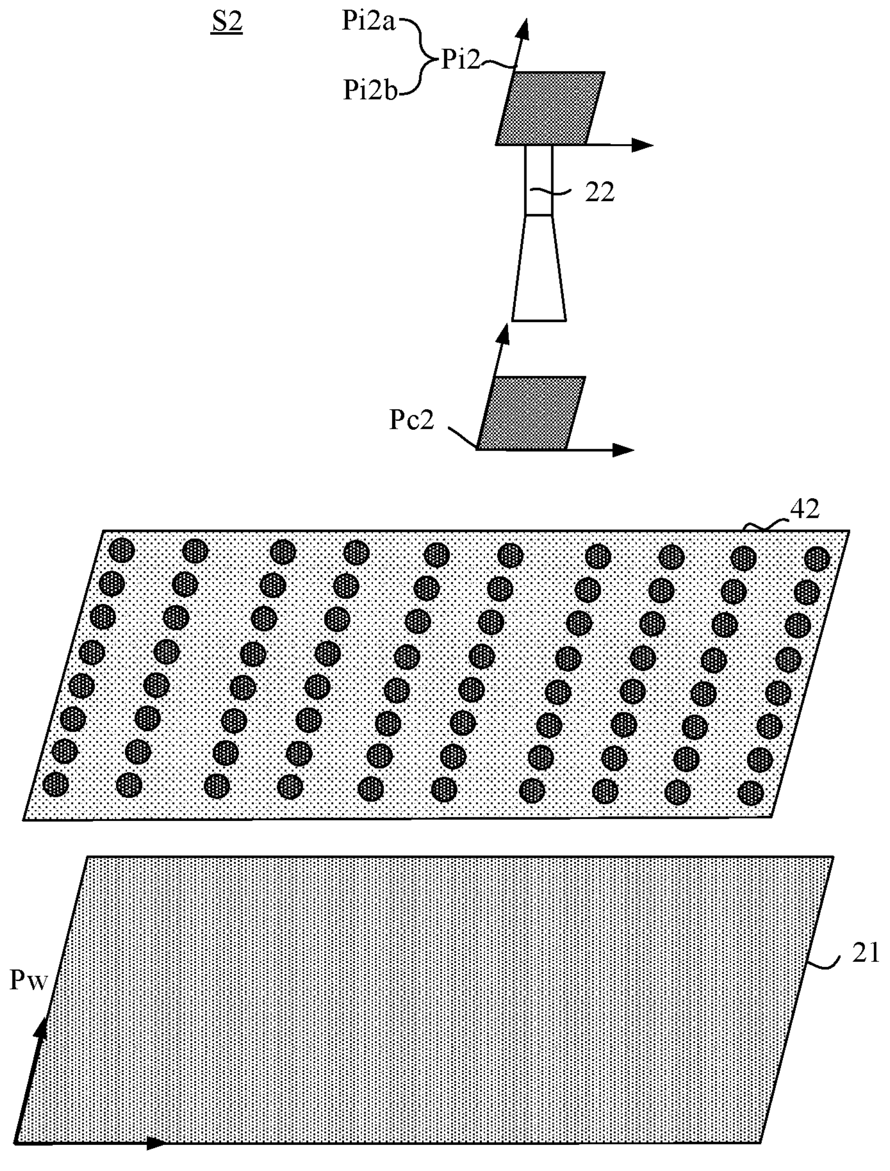
FIG. 5 is a diagram showing a step of a vision hand-eye calibration of a backplane carrying stage, in accordance with some embodiments of the present disclosure.

In S2, as shown in FIG. 5, a second mapping relationship between a second image pixel coordinate system Pi2 of the backplane carrying stage 21 and the world coordinate system Pw is determined by performing a vision hand-eye calibration on the backplane carrying stage 21.

For example, a coordinate conversion relationship between the camera 22 and a moving component (e.g., the backplane carrying stage 21) is obtained by the vision hand-eye calibration. Therefore, coordinates in the second image pixel coordinate system Pi2 in vision are represented in the world coordinate system Pw.

The second mapping relationship between the second image pixel coordinate system Pi2 of the backplane carrying stage 21 and the world coordinate system Pw is established through step S2, so that coordinates on the image captured by the camera 22 of the backplane carrying stage 21 may be converted to coordinates in the world coordinate system Pw.

Figure 6:
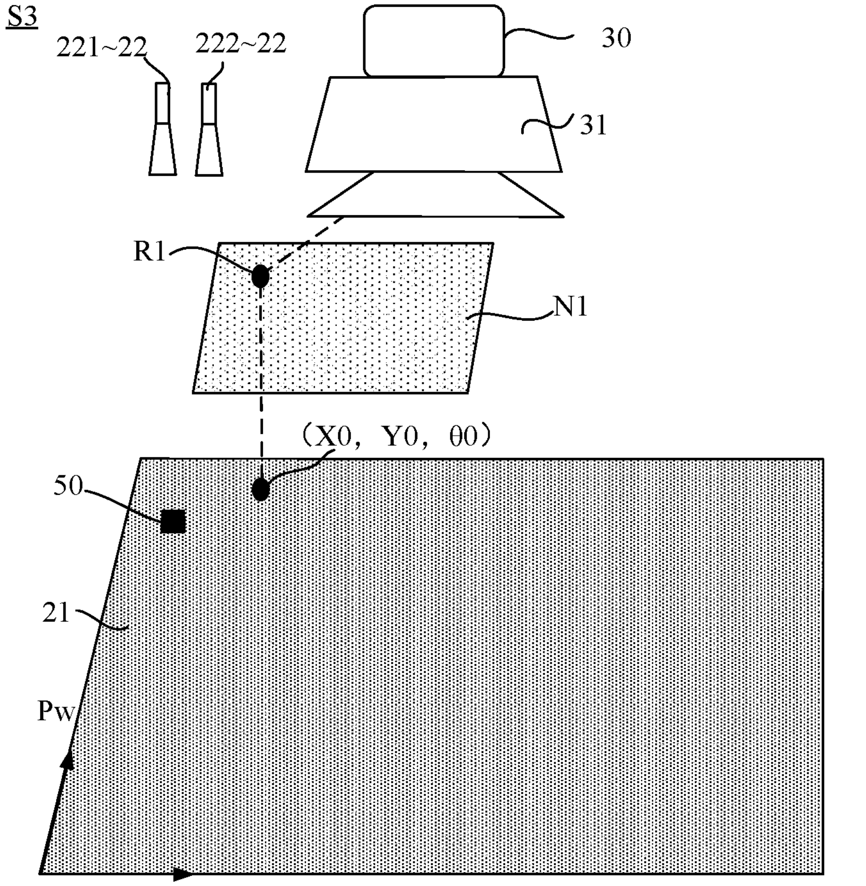
FIG. 6 is a diagram showing a step of determining coordinates of a start point of a galvanometer of a laser located in a world coordinate system, in accordance with some embodiments of the present disclosure.

In S3, as shown in FIG. 6, galvanometer start point coordinates (X0, Y0, θ0) of a start point of 4a galvanometer of the laser in the world coordinate system Pw are determined.

For example, through the movement of the backplane carrying stage 21 and the observation of the camera 22 of the backplane carrying stage 21, a third mapping relationship between a galvanometer coordinate system of the laser and the world coordinate system Pw is determined. Then, the galvanometer start point coordinates (X0, Y0, θ0) of the start point of the galvanometer of the laser in the world coordinate system Pw are determined through the established third mapping relationship.

The position of the light spot of the galvanometer 30 in the world coordinate system Pw may be determined through step S3, so as to determine whether the light spot of the laser irradiates a target position. The target position may be understood as a position where the light spot is expected to irradiate.

In S4, first template calibration coordinates of the intermediate carrier substrate 10 in the world coordinate system Pw are obtained by using the first mapping relationship and the galvanometer start point coordinates (X0, Y0, θ0).

For example, the first template calibration coordinates are reference standard coordinates of the intermediate carrier substrate 10 in the world coordinate system Pw. For example, the reference standard coordinates of the intermediate carrier substrate 10 in the world coordinate system Pw are established through a standard sheet (or a sampling sheet) of the intermediate carrier substrate 10.

The reference standard coordinates of the intermediate carrier substrate 10 in the world coordinate system Pw are established through step S4, so as to determine position deviation coordinates of the intermediate carrier substrate 10 to be aligned in the subsequent manufacturing process.

In S5, second template calibration coordinates of the backplane 20 in the world coordinate system Pw are obtained by using the second mapping relationship and the galvanometer start point coordinates (X0, Y0, θ0).

For example, the second template calibration coordinates are reference standard coordinates of the backplane 20 in the world coordinate system Pw. For example, the reference standard coordinates of the backplane 20 in the world coordinate system Pw are established through a standard sheet (or a sampling sheet) of the backplane 20.

The reference standard coordinates of the backplane 20 in the world coordinate system Pw are established through step S5, so as to determine position deviation coordinates of the backplane 20 to be aligned in the subsequent manufacturing process.

In S6, during the mass transfer process, the intermediate carrier substrate 10 is aligned based on actual coordinates of the intermediate carrier substrate carrying stage 11 and the first template calibration coordinates.

It should be noted that the actual coordinates of the intermediate carrier substrate carrying stage 11 refer to coordinates of the intermediate carrier substrate carrying stage 11 in the world coordinate system Pw.

That is to say, during the alignment of the intermediate carrier substrate 10, the coordinates of the intermediate carrier substrate 10 are determined by comparing the actual coordinates of the intermediate carrier substrate carrying stage 11 with the position deviation coordinates of the first template calibration coordinates, so that the alignment of intermediate carrier substrate 10 is completed.

In S7, during the mass transfer process, the backplane 20 is aligned based on the actual coordinates of the backplane carrying stage 21 and the second template calibration coordinates.

It should be noted that the actual coordinates of the backplane carrying stage 21 refer to coordinates of the backplane carrying stage 21 in the world coordinate system Pw.

That is to say, during the alignment of the backplane 20, the coordinates of the backplane 20 are determined by comparing the actual coordinates of the backplane carrying stage 21 with the position deviation coordinates of the second template calibration coordinates, so that the alignment of the backplane 20 is completed.

After the alignment of the intermediate carrier substrate 10 and the alignment of the backplane 20 are completed, the alignment of the intermediate carrier substrate 10 and the backplane 20 may be realized. Therefore, through the above steps S1 to S7, the alignment of the intermediate carrier substrate 10 and the backplane 20 may be realized accurately and efficiently, which improves the efficiency of mass production of Micro-LEDs and Mini-LEDs.

Figure 7:
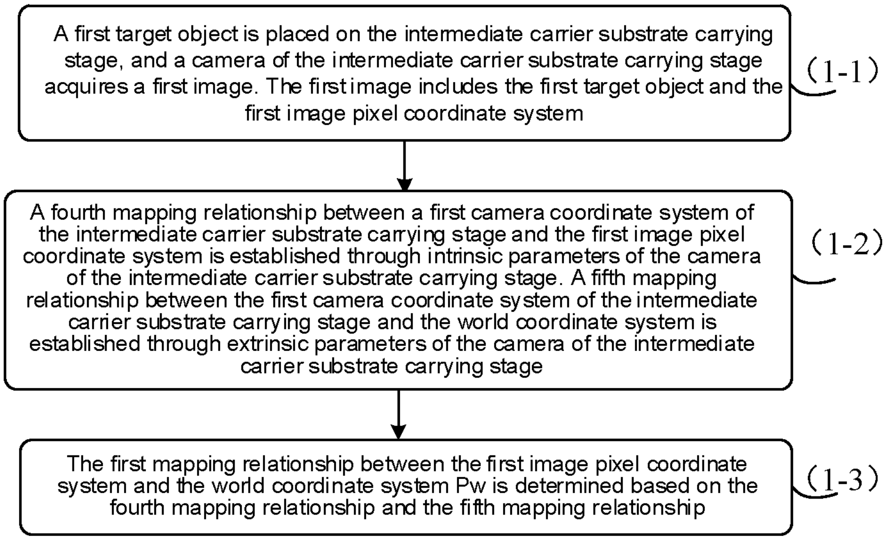
FIG. 7 is a flow diagram of a vision hand-eye calibration of an intermediate carrier substrate carrying stage, in accordance with some embodiments of the present disclosure.

In some embodiments, as shown in FIGS. 4 and 7, the step S1 in which the first mapping relationship between the first image pixel coordinate system Pi1 of the intermediate carrier substrate carrying stage 11 and the world coordinate system Pw by performing the vision hand-eye calibration on the intermediate carrier substrate carrying stage 11 includes steps (1-1) to (1-3).

In step (1-1), a first target object 41 is placed on the intermediate carrier substrate carrying stage 11, and the camera 12 of the intermediate carrier substrate carrying stage 11 acquires a first image. The first image includes the first target object 41 and the first image pixel coordinate system Pi1.

For example, the first target object 41 includes a vision calibration board. For example, the vision calibration board is a glass substrate, and a size of the glass substrate is consistent with a size of a top surface of the intermediate carrier substrate carrying stage 11.

In step (1-2), a fourth mapping relationship between a first camera coordinate system Pc1 of the intermediate carrier substrate carrying stage 11 and the first image pixel coordinate system Pi1 is established through intrinsic parameters of the camera 12 of the intermediate carrier substrate carrying stage 11. A fifth mapping relationship between the first camera coordinate system Pc1 of the intermediate carrier substrate carrying stage 11 and the world coordinate system Pw is established through extrinsic parameters of the camera 12 of the intermediate carrier substrate carrying stage 11.

The intrinsic parameters of the camera 12 may truly reflect position information of pixels in an image. The extrinsic parameters of the camera 12 refer to mapping and binding capture data and data that is actually obtained by the camera 12 after calculation according to the placement position, height, etc. of the camera 12. In a charge coupled device (CCD) of the camera 12, coordinates of the first target object 41 in the image may be converted into coordinates in the world coordinate system Pw by changing the intrinsic parameters and extrinsic parameters of the camera 12.

In step (1-3), the first mapping relationship between the first image pixel coordinate system Pi1 and the world coordinate system Pw is determined based on the fourth mapping relationship and the fifth mapping relationship.

A target point in the image is determined according to an image processing algorithm, and coordinates of the target point in the first image pixel coordinate system Pi1 are converted to coordinates in the world coordinate system Pw through the first mapping relationship in step (1-3), thereby realizing the conversion from image pixel coordinates to world coordinates.

Based on the coordinates in the first image pixel coordinate system Pi1 and the first mapping relationship, the transfer of the intermediate carrier substrate carrying stage 11 in the world coordinate system Pw may be realized through calculation. As for the specific transfer manner of the intermediate carrier substrate carrying stage 11, reference is made to the following content, and details will not be provided here.

The first mapping relationship between the first image pixel coordinate system Pi1 of the intermediate carrier substrate carrying stage 11 and the world coordinate system Pw is determined through the above steps (1-1) to (1-3). The coordinates of the image captured by the camera 12 of the intermediate carrier substrate carrying stage 11 may be converted into the coordinates in the world coordinate system Pw, so as to align the intermediate carrier substrate carrying stage 11.

In some embodiments, as shown in FIG. 2, the camera 12 of the intermediate carrier substrate carrying stage 11 includes a first rough alignment camera 121 and a first fine alignment camera 122. The first rough alignment camera 121 is used to acquire a first sub-image, and the first sub-image includes a first sub-image pixel coordinate system Pila. The first fine alignment camera 122 is used to acquire a second sub-image, and the second sub-image includes a second sub-image pixel coordinate system Pi1*b*. The first image pixel coordinate system Pi1 includes the first sub-image pixel coordinate system Pila and the second sub-image pixel coordinate system Pi1*b*.

For example, as shown in FIG. 2, a position of the first fine alignment camera 122 may be fixed relative to a position of the backplane carrying stage 21. That is, there is no relative position change between the first fine alignment camera 122 and the backplane carrying stage 21.

As shown in FIG. 4, the step of determining the first mapping relationship between the first image pixel coordinate system Pi1 of the intermediate carrier substrate carrying stage 11 and the world coordinate system Pw includes: determining a first sub-mapping relationship between the first sub-image pixel coordinate system Pila and the world coordinate system Pw; determining a second sub-mapping relationship between the second sub-image pixel coordinate system Pi1*b* and the world coordinate system Pw; and determining the first mapping relationship based on the first sub-mapping relationship and the second sub-mapping relationship.

Figure 8:
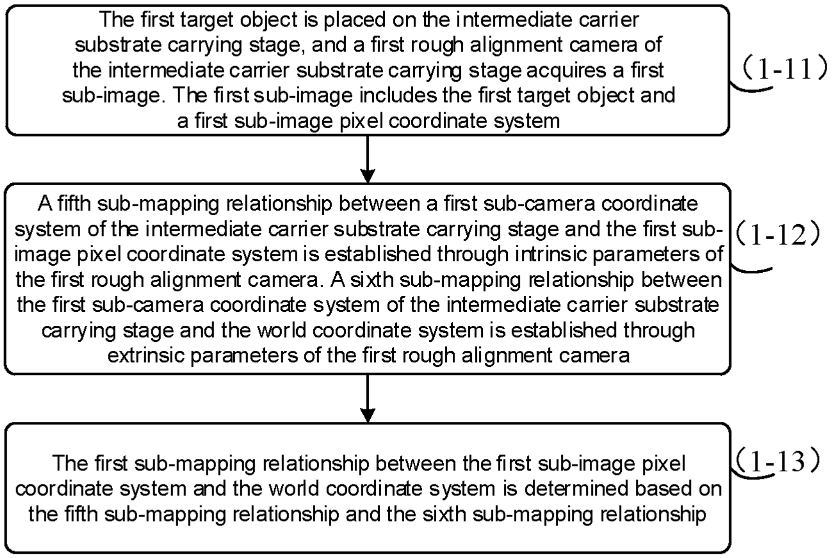
FIGS. 8 and 9 are diagrams showing steps of a vision hand-eye calibration of an intermediate carrier substrate carrying stage, in accordance with some embodiments of the present disclosure.

For example, as shown in FIG. 8, the step of determining the first sub-mapping relationship between the first sub-image pixel coordinate system Pila of the intermediate carrier substrate carrying stage 11 and the world coordinate system Pw includes steps (1-11) to (1-13).

In step (1-11), the first target object 41 is placed on the intermediate carrier substrate carrying stage 11, and the first rough alignment camera 121 of the intermediate carrier substrate carrying stage 11 acquires the first sub-image. The first sub-image includes the first target object 41 and the first sub-image pixel coordinate system Pila.

In step (1-12), a fifth sub-mapping relationship between a first sub-camera coordinate system of the intermediate carrier substrate carrying stage 11 and the first sub-image pixel coordinate system Pila is established through intrinsic parameters of the first rough alignment camera 121. A sixth sub-mapping relationship between the first sub-camera coordinate system of the intermediate carrier substrate carrying stage 11 and the world coordinate system Pw is established through extrinsic parameters of the first rough alignment camera 121.

In step (1-13), the first sub-mapping relationship between the first sub-image pixel coordinate system Pila and the world coordinate system Pw is determined based on the fifth sub-mapping relationship and the sixth sub-mapping relationship.

Figure 9:
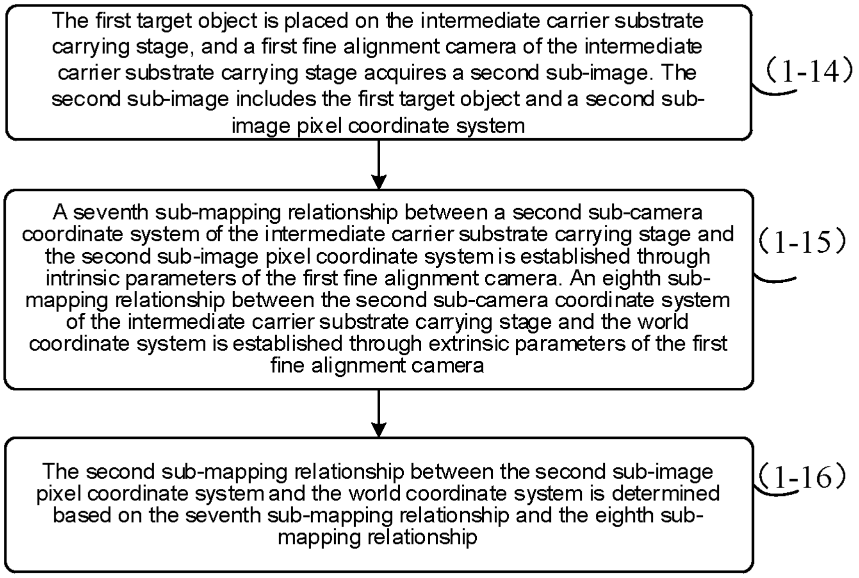

For example, as shown in FIG. 9, the step of determining the second sub-mapping relationship between the second sub-image pixel coordinate system Pi1*b* of the intermediate carrier substrate carrying stage 11 and the world coordinate system Pw includes steps (1-14) to (1-16).

In step (1-14), the first target object 41 is placed on the intermediate carrier substrate carrying stage 11, and the first fine alignment camera 122 of the intermediate carrier substrate carrying stage 11 acquires the second sub-image. The second sub-image includes the first target object 41 and the second sub-image pixel coordinate system Pi1*b*.

In step (1-15), a seventh sub-mapping relationship between a second sub-camera coordinate system of the intermediate carrier substrate carrying stage 11 and the second sub-image pixel coordinate system Pi1*b* is established through intrinsic parameters of the first fine alignment camera 122. An eighth sub-mapping relationship between the second sub-camera coordinate system of the intermediate carrier substrate carrying stage 11 and the world coordinate system Pw is established through extrinsic parameters of the first fine alignment camera 122.

In step (1-16), the second sub-mapping relationship between the second sub-image pixel coordinate system Pi1*b* and the world coordinate system Pw is determined based on the seventh sub-mapping relationship and the eighth sub-mapping relationship.

It should be noted that the first camera coordinate system Pc1 includes the first sub-camera coordinate system and the second sub-camera coordinate system.

The first mapping relationship is determined based on the first sub-mapping relationship obtained in the above steps (1-11) to (1-13) and the second sub-mapping relationship obtained in the steps (1-14) to (1-16).

Figure 10:
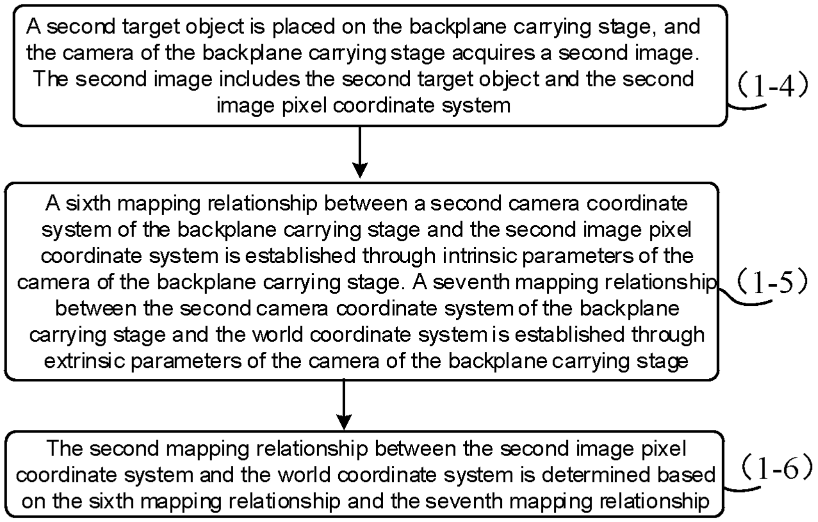
FIG. 10 is a flow diagram of a vision hand-eye calibration of a backplane carrying stage, in accordance with some embodiments of the present disclosure.

In some embodiments, as shown in FIGS. 5 and 10, the step S2 in which the second mapping relationship between the second image pixel coordinate system Pi2 of the backplane carrying stage 21 and the world coordinate system Pw by performing the vision hand-eye calibration on the backplane carrying stage 21 includes steps (1-4) to (1-6).

In step (1-4), a second target object 42 is placed on the backplane carrying stage 21, and the camera 22 of the backplane carrying stage 21 acquires a second image. The second image includes the second target object 42 and the second image pixel coordinate system Pi2.

For example, the second target object 42 includes a vision calibration board. For example, the vision calibration board is a glass substrate, and a size of the glass substrate is consistent with a size of a top surface of the backplane carrying stage 21.

In step (1-5), a sixth mapping relationship between a second camera coordinate system Pc2 of the backplane carrying stage 21 and the second image pixel coordinate system Pi2 is established through intrinsic parameters of the camera 22 of the backplane carrying stage 21. A seventh mapping relationship between the second camera coordinate system Pc2 of the backplane carrying stage 21 and the world coordinate system Pw is established through extrinsic parameters of the camera 22 of the backplane carrying stage 21.

Coordinates of the second target object 42 in the image may be converted into coordinates in the world coordinate system Pw through the intrinsic parameters and extrinsic parameters of the camera 22 of the backplane carrying stage 21.

In step (1-6), the second mapping relationship between the second image pixel coordinate system Pi2 and the world coordinate system Pw is determined based on the sixth mapping relationship and the seventh mapping relationship.

A target point in the image is determined according to an image processing algorithm, and coordinates of the target point in the second image pixel coordinate system Pi2 are converted into coordinates in the world coordinate system Pw through the second mapping relationship in the step (1-6), thereby realizing the conversion from image pixel coordinates to world coordinates.

Based on the coordinates in the second image pixel coordinate system Pi2 and the second mapping relationship, the transfer of the backplane carrying stage 21 in the world coordinate system Pw may be realized through calculation. As for the specific transfer manner of the backplane carrying stage 21, reference is made to the following content, and details will not be provided here.

Through the above steps (1-4) to (1-6), the second mapping relationship between the second image pixel coordinate system Pi2 of the backplane carrying stage 21 and the world coordinate system Pw is determined. The coordinates of the image captured by the camera 22 of the backplane carrying stage 21 may be converted into the coordinates in the world coordinate system Pw, so as to align the backplane carrying stage 21.

In some embodiments, as shown in FIG. 2, the camera 22 of the backplane carrying stage 21 includes a second rough alignment camera 221 and a second fine alignment camera 222. The second rough alignment camera 221 is used to acquire a third sub-image, and the third sub-image includes a third sub-image pixel coordinate system Pi2*a*. The second fine alignment camera 222 is used to acquire a fourth sub-image, and the fourth sub-image includes a fourth sub-image pixel coordinate system Pi2*b*. The second image pixel coordinate system Pi2 includes the third sub-image pixel coordinate system Pi2*a* and the fourth sub-image pixel coordinate system Pi2*b*.

As shown in FIG. 5, the step of determining the second mapping relationship between the second image pixel coordinate system Pi2 of the backplane carrying stage 21 and the world coordinate system Pw includes: determining a third sub-mapping relationship between the third sub-image pixel coordinate system Pi2*a* and the world coordinate system Pw; determining a fourth sub-mapping relationship between the fourth sub-image pixel coordinate system Pi2*b* and the world coordinate system Pw; and determining the second mapping relationship based on the third sub-mapping relationship and the fourth sub-mapping relationship.

Figure 11:
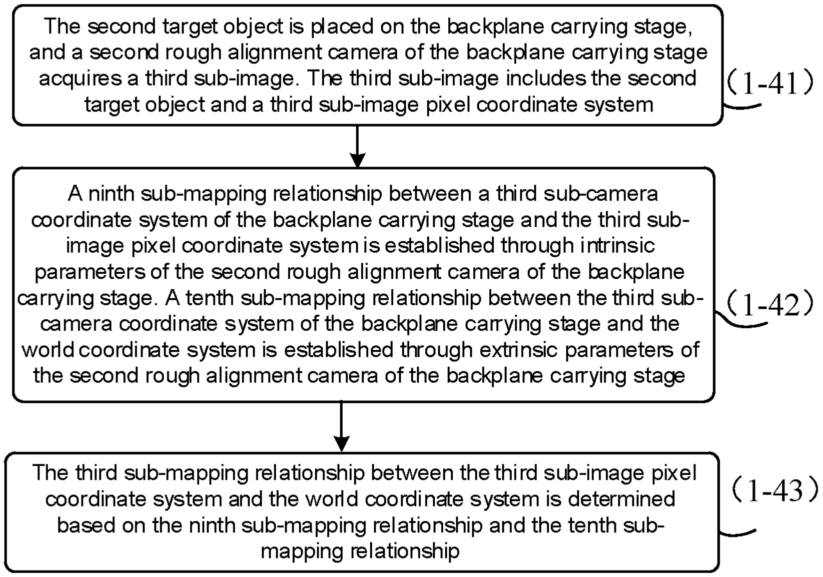
FIGS. 11 and 12 are diagrams showing steps of a vision hand-eye calibration of a backplane carrying stage, in accordance with some embodiments of the present disclosure.

For example, as shown in FIG. 11, the step of determining the third sub-mapping relationship between the third sub-image pixel coordinate system Pi2*a* and the world coordinate system Pw includes steps (1-41) to (1-43).

In step (1-41), the second target object 42 is placed on the backplane carrying stage 21, and the second rough alignment camera 221 of the backplane carrying stage 21 acquires the third sub-image. The third sub-image includes the second target object 42 and the third sub-image pixel coordinate system Pi2*a*.

In step (1-42), a ninth sub-mapping relationship between a third sub-camera coordinate system of the backplane carrying stage 21 and the third sub-image pixel coordinate system Pi2*a* is established through intrinsic parameters of the second rough alignment camera 221 of the backplane carrying stage 21. A tenth sub-mapping relationship between the third sub-camera coordinate system of the backplane carrying stage 21 and the world coordinate system Pw is established through extrinsic parameters of the second rough alignment camera 221 of the backplane carrying stage 21.

In step (1-43), the third sub-mapping relationship between the third sub-image pixel coordinate system Pi2*a* and the world coordinate system Pw is determined based on the ninth sub-mapping relationship and the tenth sub-mapping relationship.

Figure 12:
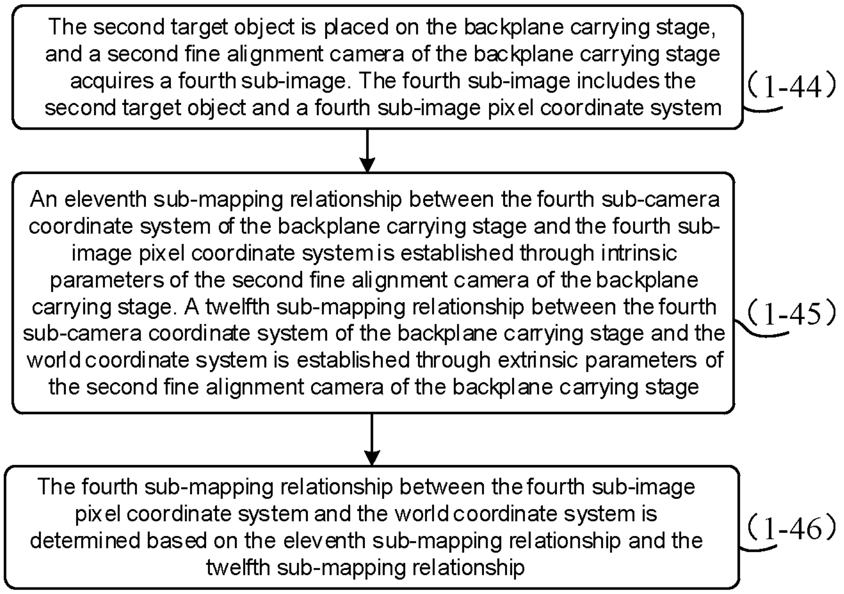

For example, as shown in FIG. 12, the step of determining the fourth sub-mapping relationship between the fourth sub-image pixel coordinate system Pi2*b* and the world coordinate system Pw includes steps (1-44) to (1-46).

In step (1-44), the second target object 42 is placed on the backplane carrying stage 21, and the second fine alignment camera 222 of the backplane carrying stage 21 acquires the fourth sub-image. The fourth sub-image includes the second target object 42 and the fourth sub-image pixel coordinate system Pi2*b*.

In step (1-45), an eleventh sub-mapping relationship between the fourth sub-camera coordinate system of the backplane carrying stage 21 and the fourth sub-image pixel coordinate system Pi2*b* is established through intrinsic parameters of the second fine alignment camera 222 of the backplane carrying stage 21. A twelfth sub-mapping relationship between the fourth sub-camera coordinate system of the backplane carrying stage 21 and the world coordinate system Pw is established through extrinsic parameters of the second fine alignment camera 222 of the backplane carrying stage 21.

In step (1-46), the fourth sub-mapping relationship between the fourth sub-image pixel coordinate system Pi2*b* and the world coordinate system Pw is determined based on the eleventh sub-mapping relationship and the twelfth sub-mapping relationship.

It should be noted that the second camera coordinate system Pc2 includes the third sub-camera coordinate system and the fourth sub-camera coordinate system.

The second mapping relationship is determined based on the third sub-mapping relationship obtained in the above steps (1-41) to (1-43) and the fourth sub-mapping relationship obtained in the steps (1-44) to (1-46).

For example, the field of view of the rough alignment camera is 100 mm×100 mm, and the precision of the rough alignment camera is 100 μm. The field of view of the fine alignment camera is 10 mm×10 mm, and the precision of the fine alignment camera is 3 μm. The rough alignment camera has a large field of view, low precision, and large error range. The fine alignment camera has a high precision and small error range. The combination of cameras with two precision ranges is conducive to improving the accuracy of position coordinate adjustment. The rough alignment camera includes the first rough alignment camera 121 and the second rough alignment camera 221. The fine alignment camera includes the first fine alignment camera 122 and the second fine alignment camera 222.

Figure 13:
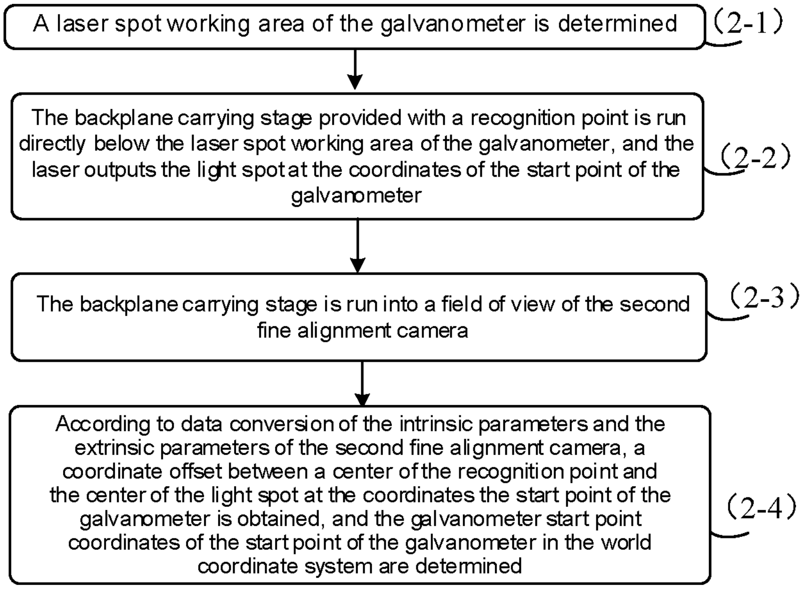
FIG. 13 is a flow diagram of a step of determining galvanometer start point coordinates of a start point of a galvanometer of a laser in a world coordinate system, in accordance with some embodiments of the present disclosure.

In some embodiments, as shown in FIGS. 6 and 13, the step S3 in which the galvanometer start point coordinates (X0, Y0, θ0) of the start point R1 of the galvanometer of the laser in the world coordinate system Pw are determined includes steps (2-1) to (2-4).

In step (2-1), a laser spot working area N1 of the galvanometer 30 is determined.

For example, as shown in FIG. 6, the laser, optical path, galvanometer 30 and field mirror 31 may determine the light spot working area N1 that meets the process requirements through selection. After the construction of the optical path of the laser is completed, the size of the light spot working area N1 is determined, and the spatial position is fixed.

For example, the size of the light spot working area N1 is 120 mm×120 mm.

In step (2-2), the backplane carrying stage 21 provided with a recognition point 50 is run directly below the laser spot working area N1 of the galvanometer 30, and the laser outputs the light spot at the coordinates of the start point R1 of the galvanometer 30.

For example, the recognition point 50 includes a square-shaped recognition point 50. For example, the size of the recognition point 50 is 100 μm×100 μm.

It should be noted that "directly below" means that the light spot working area N1 is arranged parallel to the top surface of the backplane carrying stage 21, and the light spot working area N1 and the top surface of the backplane carrying stage 21 overlap by observing along a sight line perpendicular to the top surface of the backplane carrying stage 21.

That is to say, using the backplane carrying stage 21 as a reference standard, the light spot of the start point R1 of the galvanometer 30 irradiates the backplane 20; and a galvanometer coordinate system is calibrated using the recognition point 50 on the backplane carrying stage 21 as a reference.

It should be noted that coordinates of the backplane 20 and coordinates of the backplane carrying stage 21 have a certain data conversion relationship. By converting the coordinates of the backplane 20 into coordinates in a coordinate system of the backplane carrying stage 21, the coordinates, in the world coordinate system Pw, of the coordinates of the backplane 20 may be obtained.

In step (2-3), the backplane carrying stage 21 is run into the field of view of the second fine alignment camera 222.

The fine alignment camera 222 captures images, so as to obtain coordinate data with precision that meets requirements.

In step (2-4), according to the data conversion of the intrinsic parameters and the extrinsic parameters of the second fine alignment camera 222, a coordinate offset between a center of the recognition point 50 and the center of the light spot at the coordinates the start point R1 of the galvanometer is obtained, and the galvanometer start point coordinates (X0, Y0, θ0) of the start point R1 of the galvanometer in the world coordinate system Pw are determined.

Through the above steps (2-1) to (2-4), the goal of determining the galvanometer start point coordinates (X0, Y0, θ0) of the start point R1 of the galvanometer of the laser in the world coordinate system Pw is achieved. Thus, it is used for completing the spatial matching of the galvanometer 30, the intermediate carrier substrate 10, and the backplane 20 to determine the precise position where the light spot may irradiate, and it is used for calibration of the reference standard coordinates of the intermediate carrier substrate 10 and the backplane 20 in the world coordinate system Pw.

Figure 14:
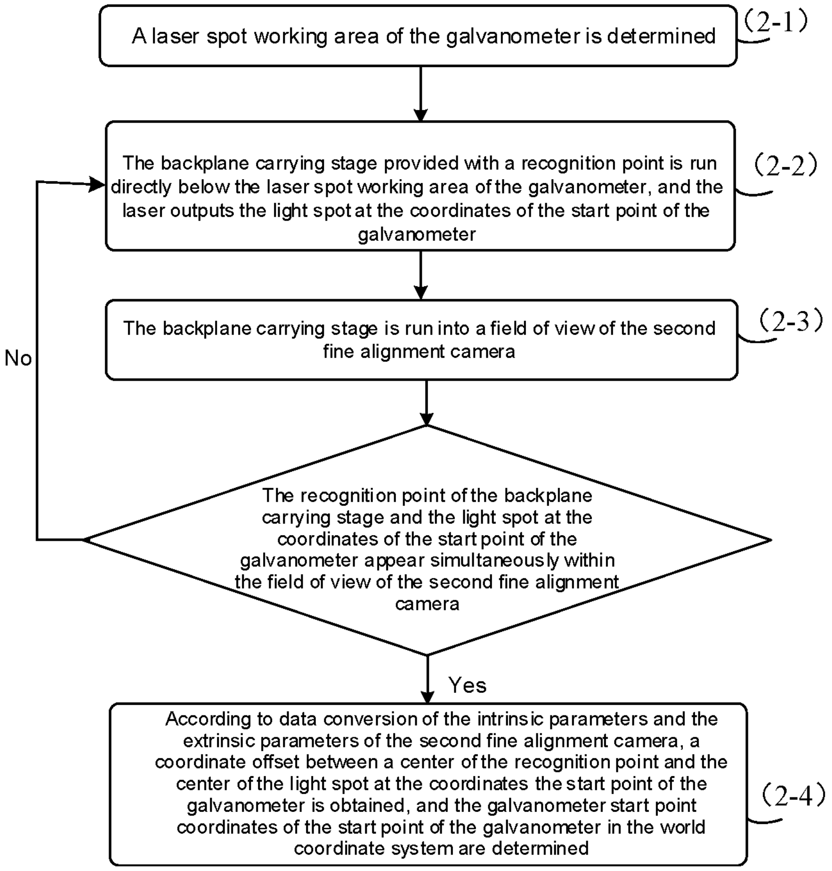
FIG. 14 is a flow diagram of a step of determining galvanometer start point coordinates of a start point of a galvanometer of a laser in a world coordinate system, in accordance with some other embodiments of the present disclosure.

In some embodiments, as shown in FIG. 14, the method of determining the step (2-3) in which the backplane carrying stage 21 is run into the field of view of the second fine alignment camera 222 includes: if the recognition point 50 of the backplane carrying stage 21 and the light spot at the coordinates of the start point R1 of the galvanometer 30 appear simultaneously within the field of view of the second fine alignment camera 222, determining that the backplane carrying stage 21 is run into the field of view of the second fine alignment camera 222; and if the recognition point 50 of the backplane carry stage 21 and the light spot at the coordinates of the start point R1 of the galvanometer 30 do not appear within the field of view of the second fine alignment camera 222 simultaneously, then returning to step (2-2).

By determining whether the recognition point 50 of the backplane carrying stage 21 and the light spot at the coordinates of the start point R1 of the galvanometer 30 appear simultaneously within the field of view of the second fine alignment camera 222, it may be accurately determined whether the backplane carrying stage 21 is run into the field of view of the second fine alignment camera 222, and it is conducive to improving the accuracy of the galvanometer start point coordinates (X0, Y0, θ0) in the world coordinate system Pw of the start point of the galvanometer of the laser.

Figure 15:
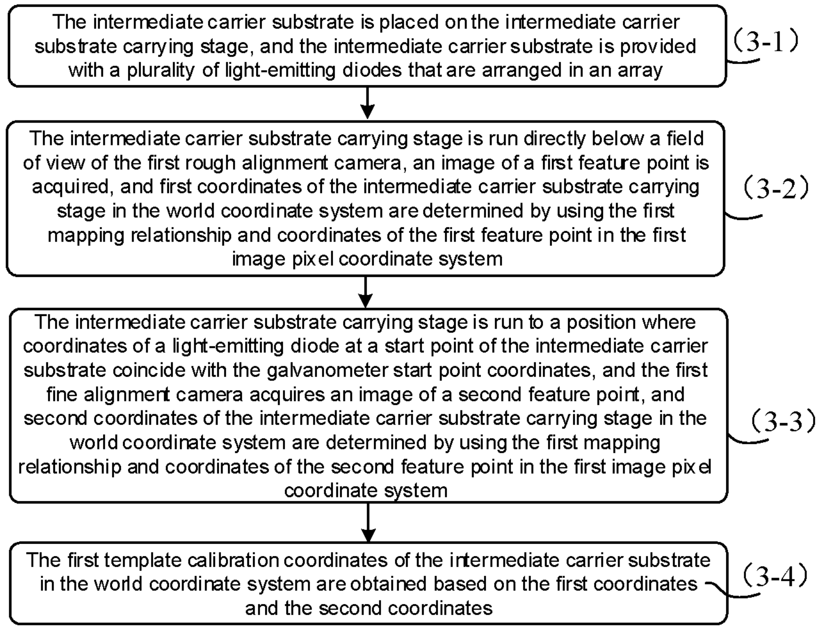
FIG. 15 is a flow diagram of a step of obtaining first template calibration coordinates of an intermediate carrier substrate in a world coordinate system, in accordance with some embodiments of the present disclosure.
Figure 16:
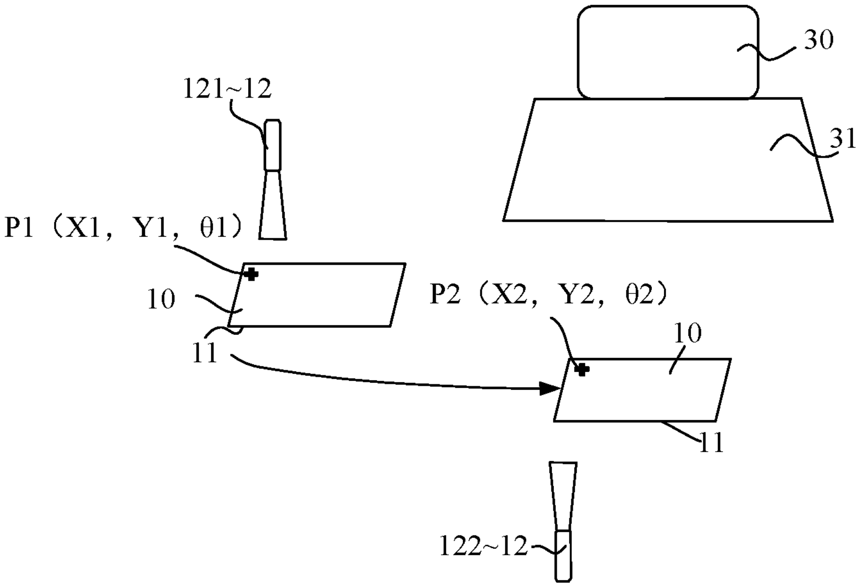
FIG. 16 is a diagram showing a step of obtaining first template calibration coordinates of an intermediate carrier substrate in a world coordinate system, in accordance with some embodiments of the present disclosure.

In some embodiments, as shown in FIGS. 15 and 16, S4 in which the first template calibration coordinates of the intermediate carrier substrate 10 in the world coordinate system Pw are obtained by using the first mapping relationship and the galvanometer start point coordinates (X0, Y0, θ0) includes steps (3-1) to (3-4).

In step (3-1), the intermediate carrier substrate 10 is placed on the intermediate carrier substrate carrying stage 11, and the intermediate carrier substrate 10 is provided with the plurality of light-emitting diodes 1 that are arranged in an array (as shown in FIG. 1).

It should be noted that the intermediate carrier substrate 10 may be superposed on the intermediate carrier substrate carrying stage 11, and in FIGS. 2 and 16, the intermediate carrier substrate 10 and the intermediate carrier substrate carrying stage 11 adopt the same pattern for representation. Since the coordinates of the intermediate carrier substrate 10 and the coordinates of the intermediate carrier substrate carrying stage 11 have a conversion relationship in the world coordinate system Pw, the same pattern is used to exemplarily represent the intermediate carrier substrate 10 and the intermediate carrier substrate carrying stage 11 in the figures.

In step (3-2), the intermediate carrier substrate carrying stage 11 is run directly below the field of view of the first rough alignment camera 121, an image of a first feature point P1 is acquired, and first coordinates (X1, Y1, θ1) of the intermediate carrier substrate carrying stage 11 in the world coordinate system Pw are determined by using the first mapping relationship and coordinates of the first feature point P1 in the first image pixel coordinate system Pi1.

For example, the feature point may be a recognition point; or the feature point may be a line of light-emitting diodes 1 located on the intermediate carrier substrate 10 (as shown in FIG. 1).

Since this step uses the image acquired by the first rough alignment camera 121, using the first mapping relationship and the coordinates of the first feature point P1 in the first image pixel coordinate system Pi1 is specifically using the first sub-mapping relationship and coordinates of the first feature point P1 in the first sub-image pixel coordinate system Pila, so as to determine the first coordinates (X1, Y1, θ1) of the intermediate carrier substrate carrying stage 11 in the world coordinate system Pw.

In step (3-3), the intermediate carrier substrate carrying stage 11 is run to a position where coordinates of a light-emitting diode 1 at a start point of the intermediate carrier substrate 10 coincide with the galvanometer start point coordinates (X0, Y0, θ0), and the first fine alignment camera 122 acquires an image of a second feature point P2, and second coordinates (X2, Y2, θ2) of the intermediate carrier substrate carrying stage 11 in the world coordinate system Pw are determined by using the first mapping relationship and coordinates of the second feature point P2 in the first image pixel coordinate system Pi1.

For example, as shown in FIG. 1, the light-emitting diode 1 at the start point of the intermediate carrier substrate 10 may be a first light-emitting diode 1 to be transferred from the intermediate carrier substrate 10. For example, the first light-emitting diode 1 may be a light-emitting diode 1 located in a first row and a first column on the intermediate carrier substrate 10, and is represented as the light-emitting diode W1 in FIG. 1.

It should be noted that, the first rough alignment camera 121 is used to acquire the image of the first feature point P1, and then the first fine alignment camera 122 is used to acquire the image of the second feature point P2, which is caused by the large displacement during the loading of the intermediate carrier substrate 10 and the position accuracy that cannot meet the requirements. For example, by providing the first rough alignment camera 121, after the loading of the intermediate carrier substrate 10, the coordinate accuracy is adjusted from about 100 μm to about 10 μm through displacement, vision correction, compensation, etc. Then, by providing the first fine alignment camera 122, the positional accuracy of the intermediate carrier substrate 10 may be narrowed from 10 μm to 3 μm, which makes the coordinate calibration more accurate.

Since this step uses the image acquired by the first fine alignment camera 122, using the first mapping relationship and the coordinates of the second feature point P2 in the first image pixel coordinate system Pi1 is specifically using the second sub-mapping relationship and the coordinates of the second feature point P2 in the second sub-image pixel coordinate system Pi1*b* to determine the second coordinates (X2, Y2, θ2) of the intermediate carrier substrate carrying stage 11 in the world coordinate system Pw.

In step (3-4), the first template calibration coordinates of the intermediate carrier substrate 10 in the world coordinate system Pw are obtained based on the first coordinates (X1, Y1, θ1) and the second coordinates (X2, Y2, θ2).

Through the above steps (3-1) to (3-4), the first template calibration coordinates of the intermediate carrier substrate 10 in the world coordinate system Pw are obtained, which provides reference standard coordinates for the alignment of the intermediate carrier substrate 10.

Figure 17:
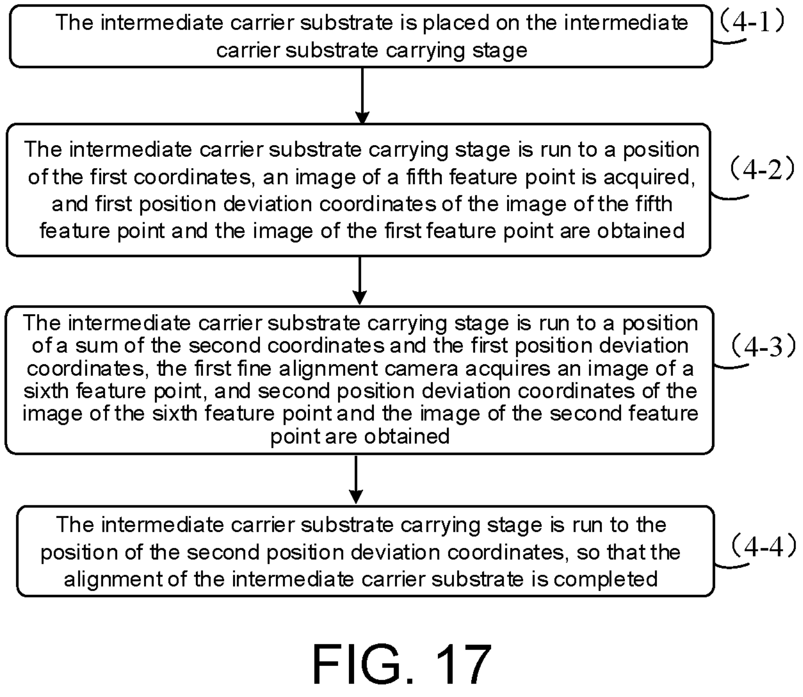
FIG. 17 is a flow diagram of an intermediate carrier substrate calibration, in accordance with some embodiments of the present disclosure.
Figure 18:
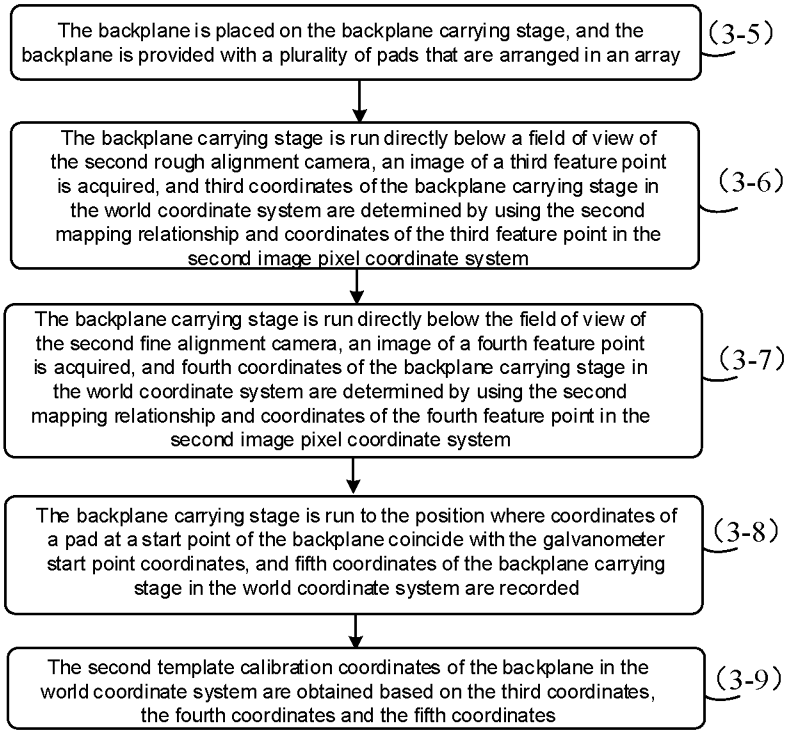
FIG. 18 is a flow diagram of a step of obtaining second template calibration coordinates of a backplane in a world coordinate system, in accordance with some embodiments of the present disclosure.

In some embodiments, as shown in FIG. 17, S6 in which in the mass transfer process, the intermediate carrier substrate 10 is aligned based on the actual coordinates of the intermediate carrier substrate carrying stage 11 and the first template calibration coordinates includes steps (4-1) to (4-4).

In step (4-1), the intermediate carrier substrate 10 is placed on the intermediate carrier substrate carrying stage 11.

In the transfer process, the loading of the intermediate carrier substrate 10 may be completed first. The intermediate carrier substrate 10, which is provided with the light-emitting diodes 1 arranged in an array, is fixed on the intermediate carrier substrate carrying stage 11, and the intermediate carrier substrate 10 is transferred by the intermediate carrier substrate carrying stage 11.

In step (4-2), the intermediate carrier substrate carrying stage 11 is run to a position of the first coordinates (X1, Y1, θ1), an image of a fifth feature point P5 is acquired, and first position deviation coordinates (Xm, Ym, Om) of the image of the fifth feature point P5 and the image of the first feature point P1 are obtained.

In the transfer process, when the intermediate carrier substrate 10 is placed on the intermediate carrier substrate carrying stage 11, the spatial movement of the intermediate carrier substrate carrying stage 11 is inevitable; and when the intermediate carrier substrate carrying stage 11 is run to the position of the first coordinates (X1, Y1, θ1) again, there will be position deviation. Through the image acquisition and the conversion of the first image pixel coordinates and the world coordinates, a deviation value of the position may be determined, and the deviation value is recorded as the first position deviation coordinates (Xm, Ym, θm).

It should be noted that the first position deviation coordinates (Xm, Ym, θm) do not represent a specific coordinate value, but refer to a coordinate sign of the deviation value generated when the intermediate carrier substrate carrying stage 11 is run to the position of the first coordinates (X1, Y1, θ1) again.

In step (4-3), the intermediate carrier substrate carrying stage 11 is run to a position of a sum of the second coordinates (X2, Y2, θ2) and the first position deviation coordinates (Xm, Ym, θm), the first fine alignment camera 122 acquires an image of a sixth feature point P6, and second position deviation coordinates (Xn, Yn, θn) of the image of the sixth feature point P6 and the image of the second feature point P2 are obtained.

The intermediate carrier substrate carrying stage 11 is run to the position of the sum of the second coordinates (X2, Y2, θ2) and the first position deviation coordinates (Xm, Ym, θm), so that the position deviation of the intermediate carrier substrate carrying stage 11 caused by the spatial movement is compensated. Then, the first fine alignment camera 122 acquires the image of the sixth feature point P6, and the second position deviation coordinates (Xn, Yn, θn) of positions of the image of the sixth feature point P6 and the image of the second feature point P2 are calculated. That is, by using the first fine alignment camera 122, a position deviation value with an accuracy meeting the requirements is recorded, and the deviation value is recorded as the second position deviation coordinates (Xn, Yn, θn).

In step (4-4), the intermediate carrier substrate carrying stage 11 is run to the position of the second position deviation coordinates (Xn, Yn, θn), so that the alignment of the intermediate carrier substrate 10 is completed.

Through the steps (4-1) to (4-4), the alignment of the intermediate carrier substrate 10 is completed based on the actual coordinates of the intermediate carrier substrate carrying stage 11 and the first template calibration coordinates.

In some embodiments, as shown in FIGS. 18 to 21, S5 in which the second template calibration coordinates of the backplane 20 in the world coordinate system Pw are obtained by using the second mapping relationship and the galvanometer start point coordinates (X0, Y0, θ0) include steps (3-5) to (3-9).

In step (3-5), the backplane 20 is placed on the backplane carrying stage 21, and the backplane 20 is provided with the plurality of pads 2 that are arranged in an array (as shown in FIG. 1).

Figure 19:
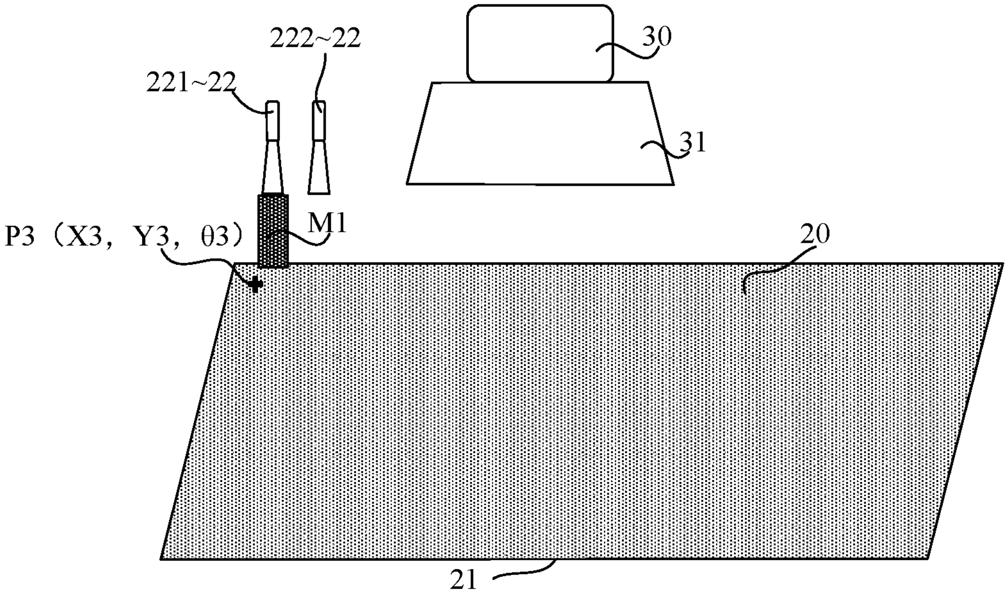
FIGS. 19 to 21 are diagrams showing steps of obtaining second template calibration coordinates of a backplane in a world coordinate system, in accordance with some embodiments of the present disclosure.

In step (3-6), as shown in FIG. 19, the backplane carrying stage 21 is run directly below the field of view of the second rough alignment camera 221, an image of a third feature point P3 is acquired, and third coordinates (X3, Y3, θ3) of the backplane carrying stage 21 in the world coordinate system Pw are determined by using the second mapping relationship and coordinates of the third feature point P3 in the second image pixel coordinate system Pi2.

For example, the feature point may be a recognition point; or the feature point may be a line of pads 2 located on the backplane 20 (as shown in FIG. 1).

For example, the field of view M1 of the second rough alignment camera 221 is as shown in FIG. 19. The field of view of the camera is generally located directly in front of the lens of the camera. The description of directly below the field of view of the second rough alignment camera 221 may be understood as the backplane carrying stage 21 moving directly below the lens of the second rough alignment camera 221.

It should be noted that the backplane 20 may be superposed on the backplane carrying stage 21, and the backplane 20 and the backplane carrying stage 21 adopt the same pattern for representation in FIGS. 2 and 19. Since coordinates of the backplane 20 and coordinates of the backplane carrying stage 21 have a conversion relationship in the world coordinate system Pw, the same pattern is used to exemplarily represent the backplane 20 and the backplane carrying stage 21 in the figures.

Since this step uses the image acquired by the second rough alignment camera 221, using the second mapping relationship and the coordinates of the third feature point P3 in the second image pixel coordinate system Pi2 is specifically using the third sub-mapping relationship and coordinates of the third feature point P3 in the third sub-image pixel coordinate system Pi2*a*, so as to determine the third coordinates (X3, Y3, θ3) of the backplane carrying stage 21 in the world coordinate system Pw.

Figure 20:
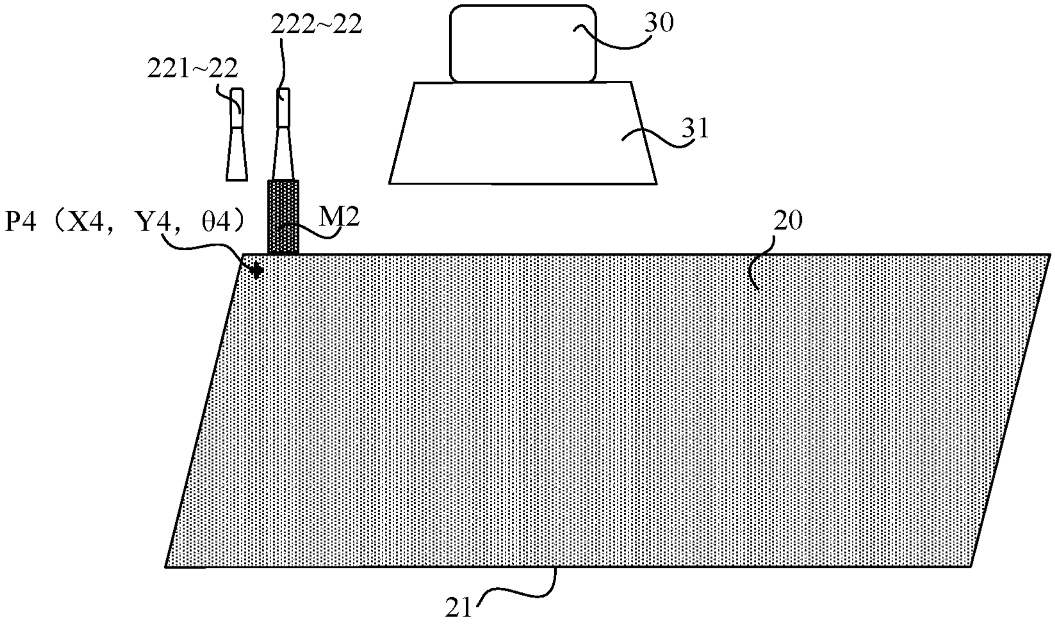

In step (3-7), as shown in FIG. 20, the backplane carrying stage 21 is run directly below the field of view of the second fine alignment camera 222, an image of a fourth feature point P4 is acquired, and fourth coordinates (X4, Y4, θ4) of the backplane carrying stage 21 in the world coordinate system Pw are determined by using the second mapping relationship and coordinates of the fourth feature point P4 in the second image pixel coordinate system Pi2.

For example, the field of view M2 of the second fine alignment camera 222 is as shown in FIG. 20.

Since this step uses the image acquired by the second fine alignment camera 222, using the second mapping relationship and the coordinates of the fourth feature point P4 in the second image pixel coordinate system Pi2 is specifically using the fourth sub-mapping relationship and coordinates of the fourth feature point P4 in the fourth sub-image pixel coordinate system Pi2*b*, so as to determine the fourth coordinates (X4, Y4, θ4) of the backplane carrying stage 21 in the world coordinate system Pw.

Figure 21:
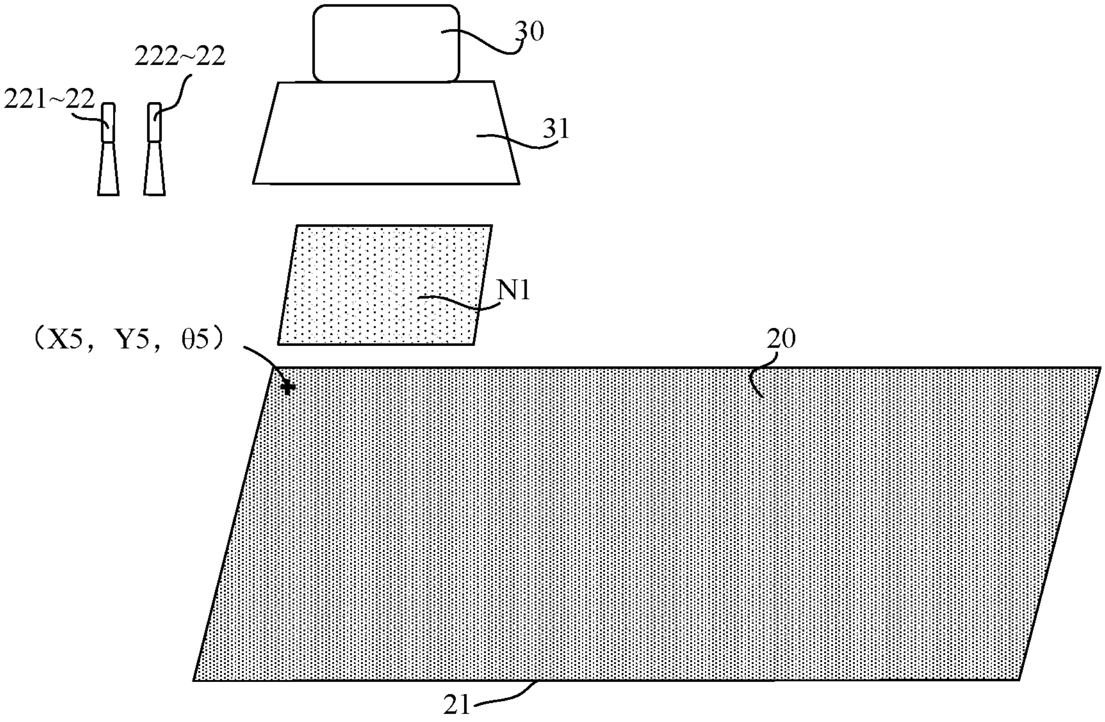

In step (3-8), as shown in FIG. 21, the backplane carrying stage 21 is run to the position where coordinates of a pad 2 at a start point of the backplane 20 coincide with the galvanometer start point coordinates (X0, Y0, θ0), and fifth coordinates (X5, Y5, θ5) of the backplane carrying stage 21 in the world coordinate system Pw are recorded.

For example, as shown in FIG. 1, the pad 2 at the start point of the backplane 20 may be understood as a pad 2 where the light-emitting diode 1 first needs to be installed in the backplane 20. For example, when the backplane 20 undergoes the alignment transfer of the light-emitting diodes 1 for the first time, a pad 2 in a first row and a first column on the backplane 20 may be defined as the pad 2 at the start point, which is denoted as W2 in FIG. 1.

In step (3-9), the second template calibration coordinates of the backplane 20 in the world coordinate system Pw are obtained based on the third coordinates (X3, Y3, θ3), the fourth coordinates (X4, Y4, θ4) and the fifth coordinates (X5, Y5, θ5).

Through the above steps (3-5) to (3-9), the second template calibration coordinates of the backplane 20 in the world coordinate system Pw are obtained, which provides reference standard coordinates for the alignment of the backplane 20.

Figure 22:
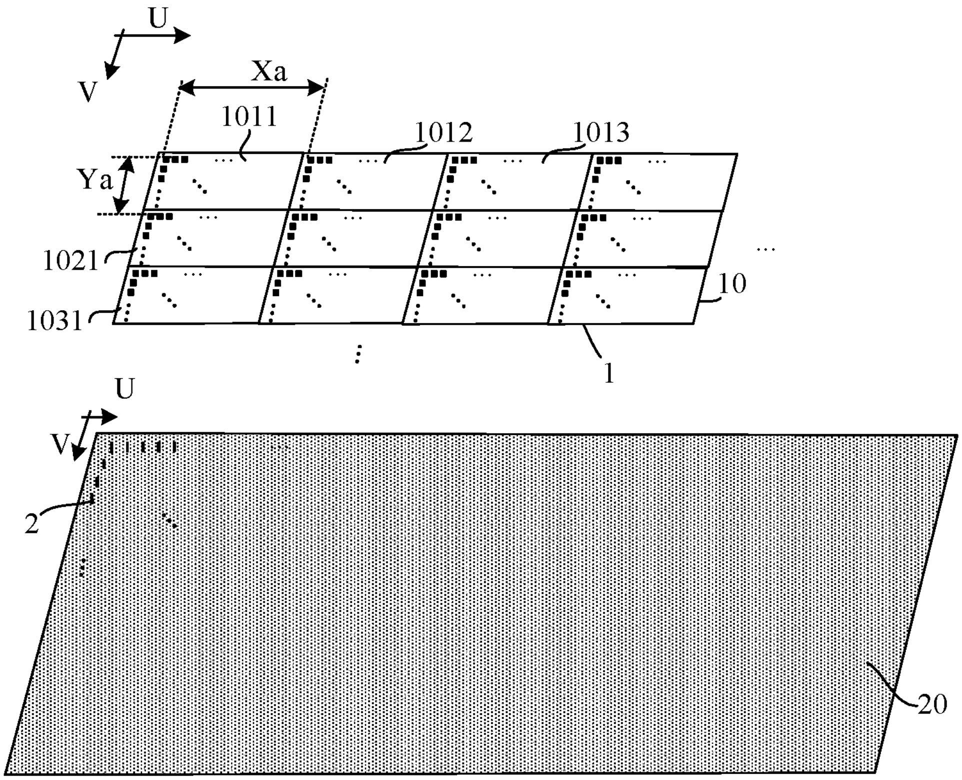
FIG. 22 is a structural diagram of an intermediate carrier substrate and a backplane, in accordance with some other embodiments of the present disclosure.

In some embodiments, as shown in FIG. 22, in the transfer process, there is a need to realize the alignment of the intermediate carrier substrate 10 and the alignment of the backplane 20, so as to realize the alignment of the intermediate carrier substrate 10 and the backplane 20, and in turn complete the transfer of the light-emitting diodes 1.

For example, as shown in FIG. 22, the alignment process of the intermediate carrier substrate 10 and the backplane 20 includes: aligning an intermediate carrier substrate 10 in a first row and a first column with the backplane 20, aligning of an intermediate carrier substrate 10 in the first row and an nth column with the backplane 20, and aligning an intermediate carrier substrate 10 in an mth row and the first column with the backplane 20. Here, n is a positive integer greater than or equal to 2, and m is a positive integer greater than or equal to 2. That is, $n \geq 2$, and $m \geq 2$. For example, an extending direction of a row in the first row and first column is the first direction U, and an extending direction of a column in the first row and first column is the second direction V.

For example, in the transfer process, as shown in FIG. 22, in order to complete the alignment of the intermediate carrier substrate 10 and the backplane 20, the alignment of the intermediate carrier substrate 10 in the first row and the first column and the backplane 20 need to be completed first. In FIG. 22, the intermediate carrier substrate 10 in the first row and the first column is represented as an intermediate carrier substrate 1011.

For example, after the alignment of the intermediate carrier substrate 1011 is completed, the alignment of the intermediate carrier substrate 1012 in the first row and a second column may be performed. At this time, n of the first row and the nth column is equal to 2. By analogy, when n is equal to 3, the alignment of the intermediate carrier substrate 1013 in the first row and a third column is performed.

For example, after the alignment of the intermediate carrier substrate 1011 is completed, the alignment of the intermediate carrier substrate 1021 in a second row and the first column may be performed. At this time, m of the mth row and the first column is equal to 2. By analogy, when m is equal to 3, the alignment of the intermediate carrier substrate 1031 in a third row and the first column is performed.

In this way, the alignment of each intermediate carrier substrate 10 and the backplane 20 is performed, so that the transfer of the light-emitting diodes 1 is completed.

For example, when the ratio of the size of the intermediate carrier substrate 10 to the size of the backplane 20 is 1:30, if 30 intermediate carrier substrates are arranged in five rows and six columns, then m is greater than or equal to 2 and less than or equal to 5, that is, 5≥m≥2; and n is greater than or equal to 2 and less than or equal to 6, that is, 6≥n≥2. A sum of sizes of 30 intermediate carrier substrates 10 is equal to a size of one backplane 20. That is, an area of 30 intermediate carrier substrates 10 and an area of one backplane 20 are equal. Then, each intermediate carrier substrate 10 of the 30 intermediate carrier substrates 10 needs to be aligned with the backplane 20, the alignment is performed 30 times, and the transfer of the light-emitting diodes 1 is completed.

Figure 23:
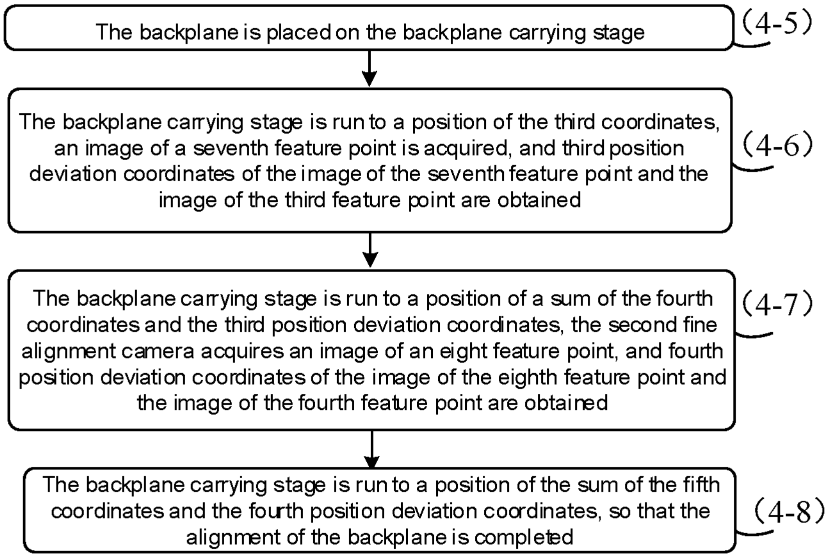
FIG. 23 is a flow diagram of a backplane calibration, in accordance with some embodiments of the present disclosure.

In some embodiments, as shown in FIG. 23, the step S7 in which during the mass transfer process, the backplane 20 is aligned based on the actual coordinates of the backplane carrying stage 21 and the second template calibration coordinates includes: aligning the backplane 20 after the intermediate carrier substrate 10 in the first row and the first column is aligned, including steps (4-5) to (4-8).

In step (4-5), the backplane 20 is placed on the backplane carrying stage 21.

In the transfer process, the loading of the backplane 20 is completed first. The backplane 20, which is provided with the pads 2 that are arranged in an array, is fixed on the backplane carrying stage 21, and the transfer of the backplane 20 is completed through the backplane carrying stage 21.

In step (4-6), the backplane carrying stage 21 is run to a position of the third coordinates (X3, Y3, θ3), an image of a seventh feature point P7 is acquired, and third position deviation coordinates (Xp, Yp, θp) of the image of the seventh feature point P7 and the image of the third feature point P3 are obtained.

In the transfer process, when the backplane 20 is placed on the backplane carrying stage 21, the spatial movement of the backplane carrying stage 21 is inevitable; and when the backplane carrying stage 21 is run to the position of the third coordinates (X3, Y3, θ3) again, there will be position deviation. Through the image acquisition and the conversion of the second image pixel coordinates and the world coordinates, a deviation value of the position may be determined, and the deviation value is recorded as the third position deviation coordinates (Xp, Yp, θp).

It should be noted that the third position deviation coordinates (Xp, Yp, θp) do not represent a specific coordinate value, but refer to a coordinate sign of the deviation value generated when the backplane carrying stage 21 is run to the position of the third coordinates (X3, Y3, θ3) again.

In step (4-7), the backplane carrying stage 21 is run to a position of a sum of the fourth coordinates (X4, Y4, θ4) and the third position deviation coordinates (Xp, Yp, θp), the second fine alignment camera 222 acquires an image of an eight feature point P8, and fourth position deviation coordinates (Xq, Yq, θq) of the image of the eighth feature point P8 and the image of the fourth feature point P4 are obtained.

The backplane carrying stage 21 is run to the position of the sum of the fourth coordinates (X4, Y4, θ4) and the third position deviation coordinates (Xp, Yp, θp), so that the position deviation caused by the spatial movement of the backplane carrying stage 21 is compensated. Then, the second fine alignment camera 222 acquires the image of the eighth feature point P8, the fourth position deviation coordinates (Xq, Yq, θq) of positions of the image of the eighth feature point P8 and the image of the fourth feature point P4 are calculated. That is, by using the second fine alignment camera 222, a position deviation value with an accuracy meeting the requirements is recorded, and the deviation value is recorded as the fourth position deviation coordinates (Xq, Yq, θq).

In step (4-8), the backplane carrying stage 21 is run to a position of the sum of the fifth coordinates (X5, Y5, θ5) and the fourth position deviation coordinates (Xq, Yq, θq), so that the alignment of the backplane 20 is completed.

For example, through the steps (4-1) to (4-4), the alignment of the intermediate carrier substrate 10 in the first row and the first column is completed based on the actual coordinates of the intermediate carrier substrate carrying stage 11 and the first template calibration coordinates. Then, through the above steps (4-5) to (4-8), the alignment of the backplane 20 is completed based on the actual coordinates of the backplane carrying stage 21 and the second template calibration coordinates. In this way, the alignment of the intermediate carrier substrate 10 in the first row and the first column and the backplane 20 is realized.

In some embodiments, as shown in FIG. 24, in the first direction U, under a standard size D1, a ratio of the number of light-emitting diodes 1 on the intermediate carrier substrate 10 to the number of pads 2 on the backplane 20 is T:1. The standard size D1 is a size occupied by a row of light-emitting diodes 1 arranged in the first direction U. T is a positive integer greater than or equal to 1, that is, T≥1.

For example, as shown in FIG. 24, in the first direction U, a distance between every two adjacent light-emitting diodes 1 on the intermediate carrier substrate 10 is 10 μm. In the first direction U, a distance between every two adjacent pads 2 on the backplane 20 is 30 μm, 60 μm or 90 μm. That is to say, the light-emitting diodes 1 are arranged more densely.

For example, when the distance between every two adjacent light-emitting diodes 1 on the intermediate carrier substrate 10 is 10 μm and the distance between every two adjacent pads 2 on the backplane 20 is 10 μm, T is 1; when the distance between every two adjacent light-emitting diodes 1 on the intermediate carrier substrate 10 is 10 μm and the distance between every two adjacent pads 2 on the backplane 20 is 30 μm, T is 3; when the distance between every two adjacent light-emitting diodes 1 on the intermediate carrier substrate 10 is 10 μm and the distance between every two adjacent pads 2 on the backplane 20 is 60 μm, T is 6; when the distance between every two adjacent light-emitting diodes 1 on the intermediate carrier substrate 10 is 10 μm and the distance between every two adjacent pads 2 on the backplane 20 is 90 μm, T is 9.

In some embodiments, as shown in FIG. 25, when T is equal to 1, the step S7 in which during the mass transfer process, the backplane 20 is aligned based on the actual coordinates of the backplane carrying stage 21 and the second template calibration coordinates includes: aligning the backplane 20 after the alignment of the intermediate carrier substrate 10 in the first row and the nth column is completed, n being a positive integer greater than or equal to 2, including steps (5-5) to (5-7).

In step (5-5), after the intermediate carrier substrate 10 in the first row and the (n−1)th column is transferred, the number of transferred light-emitting diodes 1 is recorded, and fifth position deviation coordinates (Xa, 0, 0) of the position of the start point of the intermediate carrier substrate 10 in the first row and the nth column and the position of the start point of the intermediate carrier substrate 10 in the first row and the (n−1)th column are obtained.

For example, the position of the start point of the intermediate carrier substrate 10 in the first row and the nth column and the position of the start point of the intermediate carrier substrate 10 in the first row and the (n−1)th column may be expressed as a distance, in the first direction U, between a light-emitting diode 1 at the start point of the intermediate carrier substrate 10 in the first row and nth column and a light-emitting diode 1 at the start point of the intermediate carrier substrate 10 in the first row and the (n−1)th column, that is, a distance, in the first direction U, between the light-emitting diode 1 in the first row and the nth column and the light-emitting diode 1 in the first row and the (n−1)th column, and Xa may be equal to the distance.

In step (5-6), the backplane carrying stage 21 is run to a position of a sum of the fourth coordinates (X4, Y4, θ4), the third position deviation coordinates (Xp, Yp, θp) and the fifth position deviation coordinates (Xa, 0, 0), the second fine alignment camera 222 acquires the image of the eighth feature point P8, and the fourth position deviation coordinates (Xq, Yq, θq) of the image of the eighth feature point P8 and the image of the fourth feature point P4 are obtained.

In step (5-7), the backplane carrying stage 21 is run to the position of the sum of the fifth coordinates (X5, Y5, θ5) and the fourth position deviation coordinates (Xq, Yq, θq), so that the alignment of the backplane 20 is completed.

Figure 26:
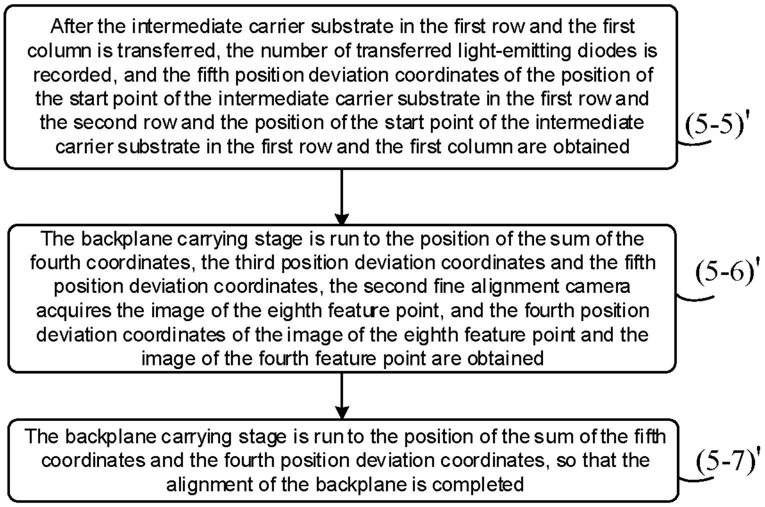
FIG. 26 is a flow diagram of a backplane calibration, in accordance with yet some other embodiments of the present disclosure.

For example, as shown in FIG. 26, when T=1 and n=2, the first row and a 2nd column are the first row and the second column. After the alignment of the intermediate carrier substrate 10 in the first row and the second column is completed, the step of aligning the backplane 20 include steps (5-5)' to (5-7)'.

In step (5-5)', after the intermediate carrier substrate 10 in the first row and the first column is transferred, the number of transferred light-emitting diodes 1 is recorded, and the fifth position deviation coordinates (Xa, 0, 0) of the position of the start point of the intermediate carrier substrate 10 in the first row and the second row and the position of the start point of the intermediate carrier substrate 10 in the first row and the first column are obtained.

For example, as shown in FIG. 22, the position of the start point of the intermediate carrier substrate 1012 in the first row and the second column and the position of the start point of the intermediate substrate 1011 in the first row and the first column may be expressed as a distance, in the first direction U, between a light-emitting diodes 1 at the start point of the intermediate carrier substrate 1012 in the first row and the second column and a light-emitting diodes 1 at the start point of the intermediate carrier substrate 1011 in the first row and the first column, and the distance is equal to Xa.

In step (5-6)', the backplane carrying stage 21 is run to the position of the sum of the fourth coordinates (X4, Y4, θ4), the third position deviation coordinates (Xp, Yp, θp) and the fifth position deviation coordinates (Xa, 0, 0), the second fine alignment camera 222 acquires the image of the eighth feature point P8, and the fourth position deviation coordinates (Xq, Yq, θq) of the image of the eighth feature point P8 and the image of the fourth feature point P4 are obtained.

In step (5-7)', the backplane carrying stage 21 is run to the position of the sum of the fifth coordinates (X5, Y5, θ5) and the fourth position deviation coordinates (Xq, Yq, θq), so that the alignment of the backplane 20 is completed.

For example, through the steps (4-1) to (4-4), based on the actual coordinates of the intermediate carrier substrate carrying stage 11 and the first template calibration coordinates, the alignment of the intermediate carrier substrate 10 in the first row and the second column is completed. Then, through the above steps (5-5)' to (5-7)', the alignment of the backplane 20 is completed based on the actual coordinates of the backplane carrying stage 21 and the second template calibration coordinates. In this way, the alignment of the intermediate carrier substrate 10 in the first row and the second column and the backplane 20 is realized.

It should be noted that the third position deviation coordinates (Xp, Yp, θp) in step (5-6) and step (5-6)' may take different values. The third position deviation coordinates (Xp, Yp, θp) only indicate that the signs of the deviation values are the same in these cases, and do not mean that the coordinates of the deviation values are equal. The fourth positional deviation coordinates (Xq, Yq, θq), the fifth positional deviation coordinates (Xa, 0, 0), and the following sixth positional deviation coordinates (Xb, 0, 0) and seventh positional deviation coordinates (0, Ya, 0) are in a similar way.

Figure 27:
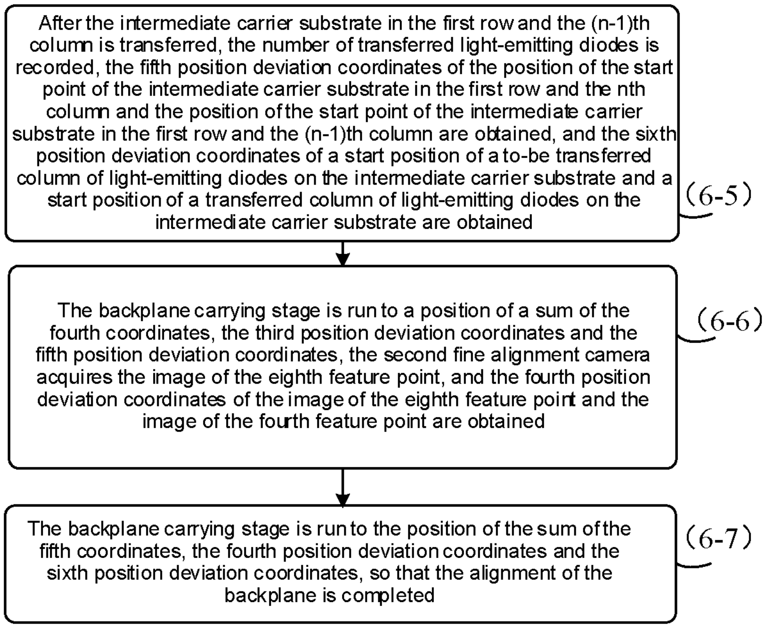
FIG. 27 is a flow diagram of a backplane calibration, in accordance with yet some other embodiments of the present disclosure.

In some embodiments, as shown in FIG. 27, when T is greater than 1, the step S7 in which during the mass transfer process, the backplane 20 is aligned based on the actual coordinates of the backplane carrying stage 21 and the second template calibration coordinates includes: aligning the backplane 20 after the alignment of the intermediate carrier substrate 10 in the first row and the nth column is completed, n being a positive integer greater than or equal to 2, including steps (6-5) to (6-7).

In step (6-5), after the intermediate carrier substrate 10 in the first row and the (n−1)th column is transferred, the number of transferred light-emitting diodes 1 is recorded, the fifth position deviation coordinates (Xa, 0, 0) of the position of the start point of the intermediate carrier substrate 10 in the first row and the nth column and the position of the start point of the intermediate carrier substrate 10 in the first row and the (n−1)th column are obtained, and the sixth position deviation coordinates (Xb, 0, 0) of a start position of a to-be transferred column of light-emitting diodes 1 on the intermediate carrier substrate 10 and a start position of a transferred column of light-emitting diodes 1 on the intermediate carrier substrate 10 (i.e., the intermediate carrier substrate 10 in the first row and the nth column) are obtained.

For example, as shown in FIG. 28, in the first direction U, the distance between every two adjacent light-emitting diodes 1 on the intermediate carrier substrate 10 is 10 μm, and the distance between every two adjacent pads 2 on the backplane 20 is 20 μm. That is, T=2.

Light-emitting diodes 1 in the dashed box L1 in FIG. 28 are the transferred column of light-emitting diodes 1, that is, this column of light-emitting diodes 1 have been separated from the intermediate carrier substrate 10 in a previous transfer process. Light-emitting diodes 1 in the dotted box L2 in FIG. 28 are the to-be-transferred column of light-emitting diodes 1, that is, this column of light-emitting diodes 1 is a target row of light-emitting diodes 1 to be separated from the intermediate carrier substrate 10 in a next transfer process. Xb in the sixth position deviation coordinates (Xb, 0, 0) of the start position of the to-be transferred column of light-emitting diodes 1 on the intermediate carrier substrate 10 and the start position of the transferred column of light-emitting diodes 1 on the intermediate carrier substrate 10 is equal to the distance of 10 μm between every two adjacent light-emitting diodes 1 on the intermediate carrier substrate 10 in the first direction U.

In step (6-6), the backplane carrying stage 21 is run to a position of a sum of the fourth coordinates (X4, Y4, θ4), the third position deviation coordinates (Xp, Yp, θp) and the fifth position deviation coordinates (Xa, 0, 0), the second fine alignment camera 222 acquires the image of the eighth feature point P8, and the fourth position deviation coordinates (Xq, Yq, θq) of the image of the eighth feature point P8 and the image of the fourth feature point P4 are obtained.

In step (6-7), the backplane carrying stage 21 is run to the position of the sum of the fifth coordinates (X5, Y5, θ5), the fourth position deviation coordinates (Xq, Yq, θq) and the sixth position deviation coordinates (Xb, 0, 0), so that the alignment of the backplane 20 is completed.

In some examples, as shown in FIG. 29, when T>1 and n=2, the first row and a 2nd column are the first row and the second column; and after the alignment of the intermediate carrier substrate 10 in the first row and the second column is completed, the step of aligning the backplane 20 includes steps (6-5)' to (6-7)'.

In step (6-5)', after the intermediate substrate 10 in the first row and the first column is transferred, the number of transferred light-emitting diodes 1 is recorded, the fifth position deviation coordinates (Xa, 0, 0) of the coordinates of the position of the start point of the intermediate carrier substrate 10 in the first row and the second column and the position of the start point of the intermediate carrier substrate 10 in the first row and the first column are obtained, and the six position deviation coordinates (Xb, 0, 0) of the start position of the to-be transferred column of light-emitting diodes 1 on the intermediate carrier substrate 10 and the start position of the transferred column of light-emitting diodes 1 on the intermediate carrier substrate 10 are obtained.

In step (6-6)', the backplane carrying stage 21 is run to the position of the sum of the fourth coordinates (X4, Y4, θ4), the third position deviation coordinates (Xp, Yp, θp) and the fifth position deviation coordinates (Xa, 0, 0), the second fine alignment camera 222 acquires the image of the eighth feature point P8, and the fourth position deviation coordinates (Xq, Yq, θq) of the image of the eighth feature point P8 and the image of the fourth feature point P4 are obtained.

In step (6-7)', the backplane carrying stage 21 is run to the position of the sum of the fifth coordinates (X5, Y5, θ5), the fourth position deviation coordinates (Xq, Yq, θq) and the sixth position deviation coordinates (Xb, 0, 0), so that the alignment of the backplane 20 is completed.

For example, through the steps (4-1) to (4-4), based on the actual coordinates of the intermediate carrier substrate carrying stage 11 and the first template calibration coordinates, the alignment of the intermediate carrier substrate 10 in the first row and the second column is completed. Then, through the above steps (6-5)' to (6-7)', the alignment of the backplane 20 is completed based on the actual coordinates of the backplane carrying stage 21 and the second template calibration coordinates. In this way, the alignment of the intermediate carrier substrate 10 in the first row and the second column and the backplane 20 is realized.

Figure 30:
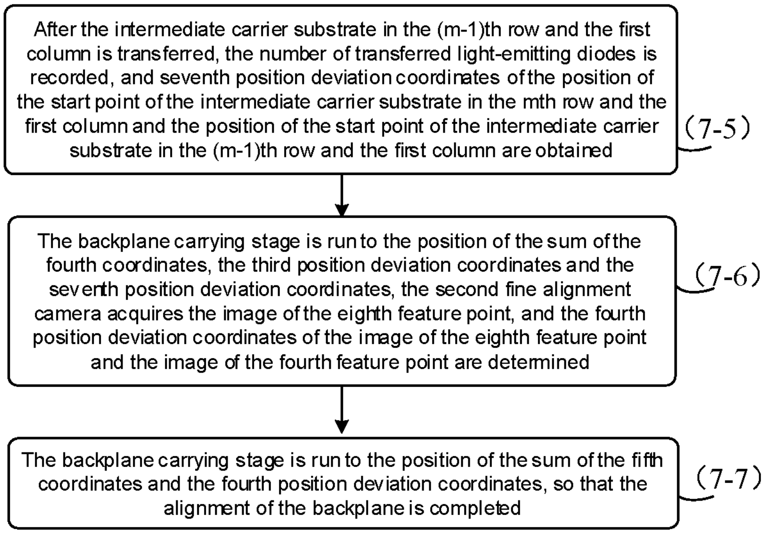
FIG. 30 is a flow diagram of a backplane calibration, in accordance with yet some other embodiments of the present disclosure.

In some embodiments, as shown in FIG. 30, when T is equal to 1, the step S7 in which during the mass transfer process, the backplane 20 is aligned based on the actual coordinates of the backplane carrying stage 21 and the second template calibration coordinates includes: after the alignment of the intermediate carrier substrate 10 in the mth row of the first column is completed, aligning the backplane 20, m being a positive integer greater than or equal to 2, including steps (7-5) to (7-7).

In step (7-5), after the intermediate carrier substrate 10 in the (m−1)th row and the first column is transferred, the number of transferred light-emitting diodes 1 is recorded, and seventh position deviation coordinates (0, Ya, 0) of the position of the start point of the intermediate carrier substrate 10 in the mth row and the first column and the position of the start point of the intermediate carrier substrate 10 in the (m−1)th row and the first column are obtained.

For example, the position of the start point of the intermediate carrier substrate 10 in the mth row and the first column and the position of the start point of the intermediate carrier substrate 10 in the (m−1)th row and the first column may be expressed as a distance in the second direction V between a light-emitting diode 1 at the start point of the intermediate carrier substrate 10 in the mth row and the first column and a light-emitting diode 1 at the start point of the intermediate carrier substrate 10 in the (m−1)th row and the first column, that is, Ya may be equal to the distance.

In step (7-6), the backplane carrying stage 21 is run to the position of the sum of the fourth coordinates (X4, Y4, θ4), the third position deviation coordinates (Xp, Yp, θp) and the seventh position deviation coordinates (0, Ya, 0), the second fine alignment camera 222 acquires the image of the eighth feature point P8, and the fourth position deviation coordinates (Xq, Yq, θq) of the image of the eighth feature point P8 and the image of the fourth feature point P4 are determined.

In step (7-7), the backplane carrying stage 21 is run to the position of the sum of the fifth coordinates (X5, Y5, θ5) and the fourth position deviation coordinates (Xq, Yq, θq), so that the alignment of the backplane 20 is completed.

Figure 31:
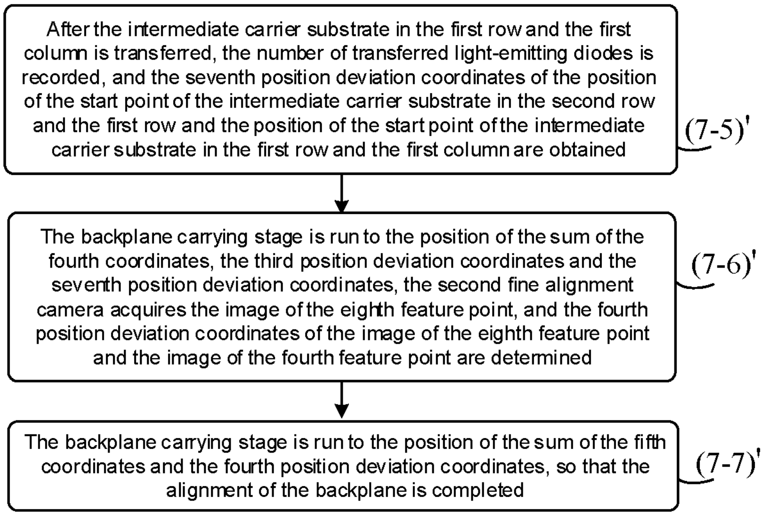
FIG. 31 is a flow diagram of a backplane calibration, in accordance with yet some other embodiments of the present disclosure.

In some examples, as shown in FIG. 31, when T=1 and m=2, the mth row of the first column is the second row of the first column; and after the alignment of the intermediate carrier substrate 10 is completed, the step of aligning the backplane 20 includes steps (7-5)' to (7-7)'.

In step (7-5)', after the intermediate carrier substrate 10 in the first row and the first column is transferred, the number of transferred light-emitting diodes 1 is recorded, and the seventh position deviation coordinates (0, Ya, 0) of the position of the start point of the intermediate carrier substrate 10 in the second row and the first row and the position of the start point of the intermediate carrier substrate 10 in the first row and the first column are obtained.

In step (7-6)', the backplane carrying stage 21 is run to the position of the sum of the fourth coordinates (X4, Y4, θ4), the third position deviation coordinates (Xp, Yp, θp) and the seventh position deviation coordinates (0, Ya, 0), the second fine alignment camera 222 acquires the image of the eighth feature point P8, and the fourth position deviation coordinates (Xq, Yq, θq) of the image of the eighth feature point P8 and the image of the fourth feature point P4 are determined.

In step (7-7)', the backplane carrying stage 21 is run to the position of the sum of the fifth coordinates (X5, Y5, θ5) and the fourth position deviation coordinates (Xq, Yq, θq), so that the alignment of the backplane 20 is completed.

For example, through the steps (4-1) to (4-4), the alignment of the intermediate carrier substrate 10 in the second row and the first column is completed based on the actual coordinates of the intermediate substrate carrying stage 11 and the first template calibration coordinates. Then, through the above steps (7-5)' to (7-7)', the alignment of the backplane 20 is completed based on the actual coordinates of the backplane carrying stage 21 and the second template calibration coordinates. Therefore, the alignment of the intermediate carrier substrate 10 in the second row and the first column and the backplane 20 is realized.

Figure 32:
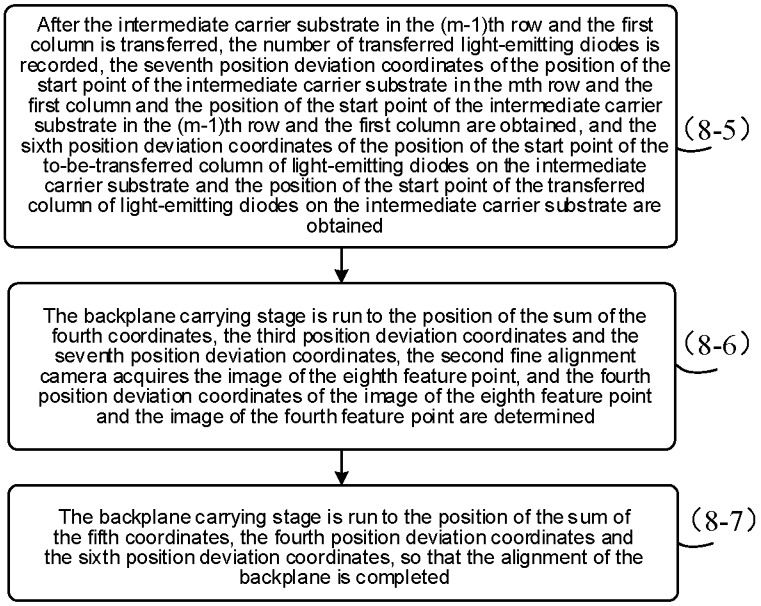
FIG. 32 is a flow diagram of a backplane calibration, in accordance with yet some other embodiments of the present disclosure.

In some embodiments, as shown in FIG. 32, when T is greater than 1, the step S7 in which during the mass transfer process, the backplane 20 is aligned based on the actual coordinates of the backplane carrying stage 21 and the second template calibration coordinates includes: after the alignment of the intermediate carrier substrate 10 in the mth row of the first column is completed, aligning the backplane 20, m being a positive integer greater than or equal to 2, including steps (8-5) to (8-7).

In step (8-5), after the intermediate carrier substrate 10 in the (m−1)th row and the first column is transferred, the number of transferred light-emitting diodes 1 is recorded, the seventh position deviation coordinates (0, Ya, 0) of the position of the start point of the intermediate carrier substrate 10 in the mth row and the first column and the position of the start point of the intermediate carrier substrate 10 in the (m−1)th row and the first column are obtained, and the sixth position deviation coordinates (Xb, 0, 0) of the position of the start point of the to-be-transferred column of light-emitting diodes 1 on the intermediate carrier substrate 10 and the position of the start point of the transferred column of light-emitting diodes 1 on the intermediate carrier substrate 10 (i.e., the intermediate carrier substrate 10 in the mth row and the first column) are obtained.

As for the understanding of Xa and Xb, reference may be made to the above content, and details will not be repeated here.

In step (8-6), the backplane carrying stage 21 is run to the position of the sum of the fourth coordinates (X4, Y4, θ4), the third position deviation coordinates (Xp, Yp, θp) and the seventh position deviation coordinates (0, Ya, 0), the second fine alignment camera 222 acquires the image of the eighth feature point P8, and the fourth position deviation coordinates (Xq, Yq, θq) of the image of the eighth feature point P8 and the image of the fourth feature point P4 are determined.

In step (8-7), the backplane carrying stage 21 is run to the position of the sum of the fifth coordinates (X5, Y5, θ5), the fourth position deviation coordinates (Xq, Yq, θq) and the sixth position deviation coordinates (Xb, 0, 0), so that the alignment of the backplane 20 is completed.

Figure 33:
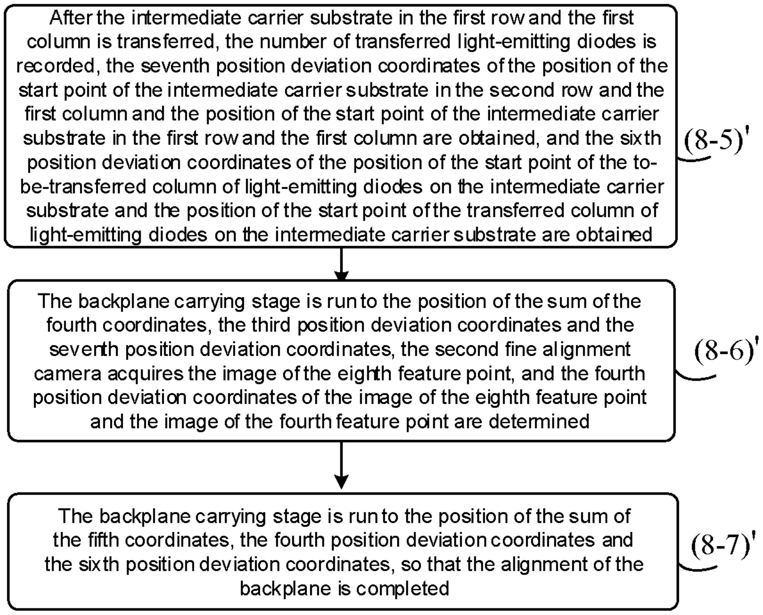
FIG. 33 is a flow diagram of a backplane calibration, in accordance with yet some other embodiments of the present disclosure.

In some examples, as shown in FIG. 33, when T>1 and m=2, the mth row and the first column is the second row and the first column; and after the alignment of the intermediate carrier substrate 10 in the second row and the first column is completed, the step of aligning the backplane 20 includes steps (8-5)' to (8-7)'.

In step (8-5)', after the intermediate carrier substrate 10 in the first row and the first column is transferred, the number of transferred light-emitting diodes 1 is recorded, the seventh position deviation coordinates (0, Ya, 0) of the position of the start point of the intermediate carrier substrate 10 in the second row and the first column and the position of the start point of the intermediate carrier substrate 10 in the first row and the first column are obtained, and the sixth position deviation coordinates (Xb, 0, 0) of the position of the start point of the to-be-transferred column of light-emitting diodes 1 on the intermediate carrier substrate 10 and the position of the start point of the transferred column of light-emitting diodes 1 on the intermediate carrier substrate 10 are obtained.

In step (8-6)', the backplane carrying stage 21 is run to the position of the sum of the fourth coordinates (X4, Y4, θ4), the third position deviation coordinates (Xp, Yp, θp) and the seventh position deviation coordinates (0, Ya, 0), the second fine alignment camera 222 acquires the image of the eighth feature point P8, and the fourth position deviation coordinates (Xq, Yq, θq) of the image of the eighth feature point P8 and the image of the fourth feature point P4 are determined.

In step (8-7)', the backplane carrying stage 21 is run to the position of the sum of the fifth coordinates (X5, Y5, θ5), the fourth position deviation coordinates (Xq, Yq, θq) and the sixth position deviation coordinates (Xb, 0, 0), so that the alignment of the backplane 20 is completed.

For example, through the steps (4-1) to (4-4), the alignment of the intermediate carrier substrate 10 in the second row and the first column is completed based on the actual coordinates of the intermediate substrate carrying stage 11 and the first template calibration coordinates. Then, through the above steps (8-5)' to (8-7)', the alignment of the backplane 20 is completed based on the actual coordinates of the backplane carrying stage 21 and the second template calibration coordinates. Therefore, the alignment of the intermediate carrier substrate 10 in the second row and the first column and the backplane 20 is realized.

It can be understood that, in the above embodiment, the alignment of the backplane 20 is performed after the alignment of the intermediate carrier substrate 10 in the first row and the first column, the alignment of the intermediate carrier substrate 10 in the first row and the second column, and the alignment of the intermediate carrier substrate 10 in the second row and the first column are completed, so that the alignment of the intermediate carrier substrates 10 and the backplane 20 is realized. As for the alignment of the remaining intermediate carrier substrates 10 and the backplane 20, reference may be made to the above content. The alignment of all intermediate carrier substrates 10 and the backplane 20 is performed through relevant steps and compensation of corresponding deviation values, so that the transfer process may be completed, and the precise alignment of the intermediate carrier substrates 10 and the backplane 20 is realized.

The multi-coordinate system calibration and equipment alignment method provided in any of the above embodiments may further be used in the alignment of a double-layer structure alignment system. For example, the alignment of the recognition point of the exposure machine and the glass. Alternatively, the alignment of the upper and lower substrates during the nano-imprinting.

Through the multi-coordinate system calibration and equipment alignment method, it may be possible to realize an accurate and efficient alignment of the upper and lower substrates.

Some embodiments of the present disclosure further provide a non-transitory computer-readable storage medium, the non-transitory computer-readable storage medium has stored computer instructions, and the computer instructions are used to cause a computer to perform the multi-coordinate system calibration and equipment alignment method as described in any of the above embodiments.

For example, the non-transitory computer-readable storage medium may include, but is not limited to a magnetic storage device (e.g., a hard disk, a floppy disk or a magnetic tape), an optical disk (e.g., a compact disk (CD) or a digital versatile disk (DVD)), a smart card and a flash memory device (e.g., an erasable programmable read-only memory (EPROM), a card, a stick or a key driver). The various computer-readable storage media described in present disclosure may represent one or more devices and/or other machine-readable storage media for storing information. The term “machine-readable storage medium” may include, but is not limited to, wireless channels and various other media capable of storing, containing, and/or carrying instructions and/or data.

Beneficial effects of the non-transitory computer-readable storage medium are the same as beneficial effects of the multi-coordinate system calibration and equipment alignment method as described in the above embodiments, and details will be not repeated here.

Figure 34:
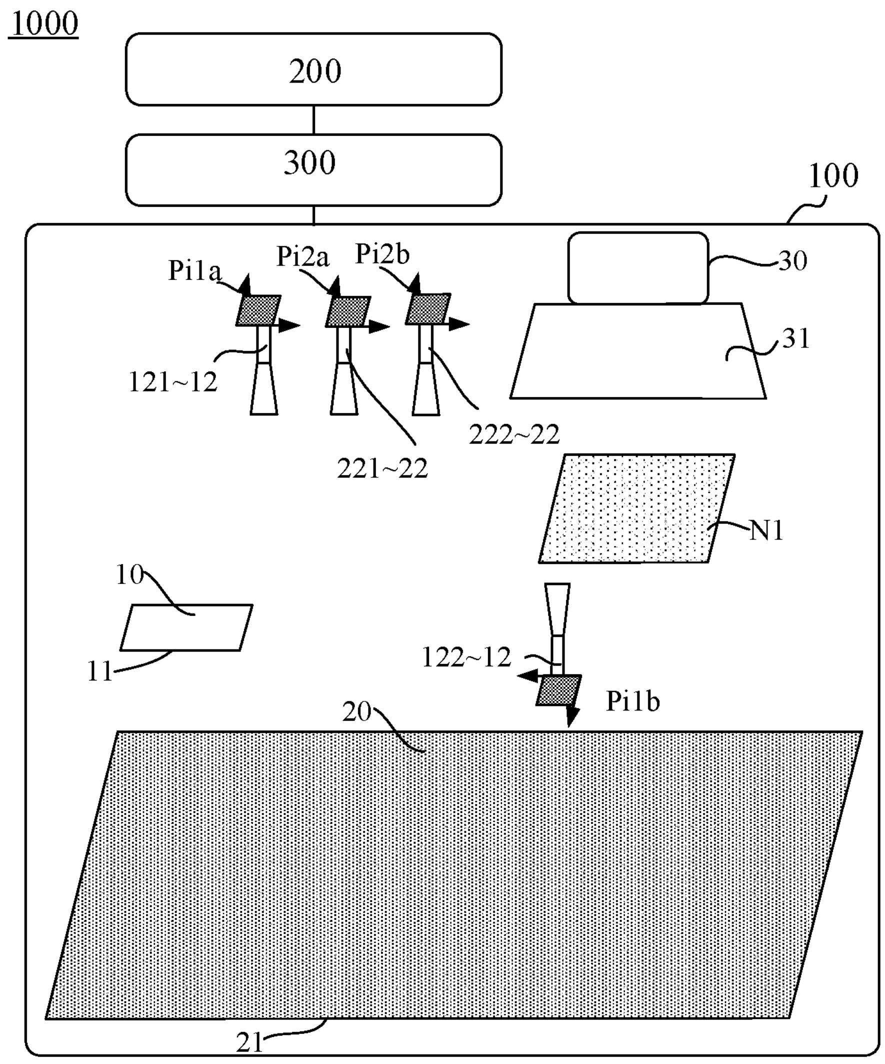
FIG. 34 is a structural diagram of a mass transfer equipment, in accordance with some embodiments of the present disclosure.

Some embodiments of the present disclosure further provide a mass transfer equipment 1000, as shown in FIG. 34, including a memory 300, an intermediate carrier substrate 10, an intermediate carrier substrate carrying stage 11, a camera 12 of the intermediate carrier substrate carrying stage 11, a backplane 20, a backplane carrying stage 21, a camera 22 of the backplane carrying stage 21, a laser, a processor 200, and a computer program stored in the memory 300 and executable on the processor 200; and the processor 200 executes the program to implement the multi-coordinate system calibration and equipment alignment method described in any one of the embodiments.

Beneficial effects of the mass transfer equipment 1000 are same as beneficial effects of the multi-coordinate system calibration and equipment alignment method as described in the above embodiments, and details will be not repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure should be determined by the protection scope of the claims.

What is claimed is:

1. A multi-coordinate system calibration and equipment alignment method, comprising:

determining a first mapping relationship between a first image pixel coordinate system of an intermediate carrier substrate carrying stage and a world coordinate system by performing a vision hand-eye calibration on the intermediate carrier substrate carrying stage;

determining a second mapping relationship between a second image pixel coordinate system of a backplane carrying stage and the world coordinate system by performing the vision hand-eye calibration on the backplane carrying stage;

determining galvanometer start point coordinates of a start point of a galvanometer of a laser in the world coordinate system;

obtaining first template calibration coordinates of an intermediate carrier substrate in the world coordinate system by using the first mapping relationship and the galvanometer start point coordinates;

obtaining second template calibration coordinates of a backplane in the world coordinate system by using the second mapping relationship and the galvanometer start point coordinates;

aligning the intermediate carrier substrate based on actual coordinates of the intermediate carrier substrate carrying stage and the first template calibration coordinates during a mass transfer process; and aligning the backplane based on actual coordinates of the backplane carrying stage and the second template calibration coordinates during the mass transfer process.

2. The multi-coordinate system calibration and equipment alignment method according to claim 1, wherein the step of determining the first mapping relationship between the first image pixel coordinate system of the intermediate carrier substrate carrying stage and the world coordinate system by performing the vision hand-eye calibration on the intermediate carrier substrate carrying stage includes:

placing a first target object on the intermediate carrier substrate carrying stage, and a camera of the intermediate carrier substrate carrying stage acquiring a first image, wherein the first image includes the first target object and the first image pixel coordinate system;

establishing a fourth mapping relationship between a first camera coordinate system of the intermediate carrier substrate carrying stage and the first image pixel coordinate system through intrinsic parameters of the camera of the intermediate carrier substrate carrying stage;

establishing a fifth mapping relationship between the first camera coordinate system of the intermediate carrier substrate carrying stage and the world coordinate system through extrinsic parameters of the camera of the intermediate carrier substrate carrying stage; and determining the first mapping relationship between the first image pixel coordinate system and the world coordinate system based on the fourth mapping relationship and the fifth mapping relationship.

3. The multi-coordinate system calibration and equipment alignment method according to claim 2, wherein the first target object and the second target object each include a vision calibration board.

4. The multi-coordinate system calibration and equipment alignment method according to claim 2, wherein the camera of the intermediate carrier substrate carrying stage includes: a first rough alignment camera and a first fine alignment camera; the first rough alignment camera is used to acquire a first sub-image, and the first sub-image includes a first sub-image pixel coordinate system; the first fine alignment camera is used to acquire a second sub-image, and the second sub-image includes a second sub-image pixel coordinate system; the first image pixel coordinate system includes the first sub-image pixel coordinate system and the second sub-image pixel coordinate system;

determining the first mapping relationship between the first image pixel coordinate system of the intermediate carrier substrate carrying stage and the world coordinate system includes:

determining a first sub-mapping relationship between the first sub-image pixel coordinate system and the world coordinate system;

determining a second sub-mapping relationship between the second sub-image pixel coordinate system and the world coordinate system; and determining the first mapping relationship based on the first sub-mapping relationship and the second sub-mapping relationship.

5. The multi-coordinate system calibration and equipment alignment method according to claim 1, wherein the camera of the intermediate carrier substrate carrying stage includes: a first rough alignment camera and a first fine alignment camera; the first rough alignment camera is used to acquire a first sub-image, and the first sub-image includes a first sub-image pixel coordinate system; the first fine alignment camera is used to acquire a second sub-image, and the second sub-image includes a second sub-image pixel coordinate system; the first image pixel coordinate system includes the first sub-image pixel coordinate system and the second sub-image pixel coordinate system;

determining the first mapping relationship between the first image pixel coordinate system of the intermediate carrier substrate carrying stage and the world coordinate system includes:

determining a first sub-mapping relationship between the first sub-image pixel coordinate system and the world coordinate system;

determining a second sub-mapping relationship between the second sub-image pixel coordinate system and the world coordinate system; and determining the first mapping relationship based on the first sub-mapping relationship and the second sub-mapping relationship.

6. The multi-coordinate system calibration and equipment alignment method according to claim 5, wherein the step of determining the second mapping relationship between the second image pixel coordinate system of the backplane carrying stage and the world coordinate system by performing the vision hand-eye calibration on the backplane carrying stage includes:

placing a second target object on the backplane carrying stage, and a camera of the backplane carrying stage acquiring a second image, wherein the second image includes the second target object and the second image pixel coordinate system;

establishing a sixth mapping relationship between a second camera coordinate system of the backplane carrying stage and the second image pixel coordinate system through intrinsic parameters of the camera of the backplane carrying stage; establishing a seventh mapping relationship between the second camera coordinate system of the backplane carrying stage and the world coordinate system through extrinsic parameters of the camera of the backplane carrying stage; and determining the second mapping relationship between the second image pixel coordinate system and the world coordinate system based on the sixth mapping relationship and the seventh mapping relationship.

7. The multi-coordinate system calibration and equipment alignment method according to claim 5, wherein the camera of the backplane carrying stage includes a second rough alignment camera and a second fine alignment camera; the second rough alignment camera is used to acquire a third sub-image, and the third sub-image includes a third sub-image pixel coordinate system; the second fine alignment camera is used to acquire a fourth sub-image, and the fourth sub-image includes a fourth sub-image pixel coordinate system; the second image pixel coordinate system includes: the third sub-image pixel coordinate system and the fourth sub-image pixel coordinate system;

determining the second mapping relationship between the second image pixel coordinate system of the backplane carrying stage and the world coordinate system includes:

determining a third sub-mapping relationship between the third sub-image pixel coordinate system and the world coordinate system;

determining a fourth sub-mapping relationship between the fourth sub-image pixel coordinate system and the world coordinate system; and determining the second mapping relationship based on the third sub-mapping relationship and the fourth sub-mapping relationship.

8. The multi-coordinate system calibration and equipment alignment method according to claim 7, wherein the step of determining the galvanometer start point coordinates of the start point of the galvanometer of the laser in the world coordinate system includes:

determining a laser spot working area of a galvanometer;

running the backplane carrying stage with a recognition point directly below the laser spot working area of the galvanometer, and the laser outputting a light spot at coordinates of the start point of the galvanometer;

running the backplane carrying stage into a field of view of the second fine alignment camera; and according to a data conversion of intrinsic parameters and extrinsic parameters of the second fine alignment camera, obtaining a coordinate offset between a center of the recognition point and a center of the light spot at the coordinates of the start point of the galvanometer, and determining the galvanometer start point coordinates of the start point of the galvanometer in the world coordinate system.

9. The multi-coordinate system calibration and equipment alignment method according to claim 8, wherein a determining method for running the backplane carrying stage into the field of view of the second fine alignment camera includes:

if the recognition point of the backplane carrying stage and the light spot at the coordinates of the start point of the galvanometer appear simultaneously within the field of view of the second fine alignment camera, determining that the backplane carrying is run into the field of view of the second fine alignment camera; and if the recognition point of the backplane carrying stage and the light spot at the coordinates of the start point of the galvanometer do not appear simultaneously within the field of view of the second fine alignment camera, returning to running the backplane carrying stage with the recognition point directly below the laser spot working area of the galvanometer and the laser outputting the light spot at the coordinates of the start point of the galvanometer.

10. The multi-coordinate system calibration and equipment alignment method according to claim 8, wherein the step of obtaining the first template calibration coordinates of the intermediate carrier substrate in the world coordinate system by using the first mapping relationship and the galvanometer start point coordinates includes:

placing the intermediate carrier substrate on the intermediate carrier substrate carrying stage, wherein the intermediate carrier substrate is provided with a plurality of light-emitting diodes that are arranged in an array;

running the intermediate carrier substrate carrying stage directly below a field of view of the first rough alignment camera, acquiring an image of a first feature point, and determining first coordinates of the intermediate carrier substrate carrying stage in the word coordinate system by using the first mapping relationship and coordinates of the first feature point in the first image pixel coordinate system;

running the intermediate carrier substrate carrying stage to a position where coordinates of a light-emitting diode at a start point of the intermediate carrier substrate coincide with the galvanometer start point coordinates, the first fine alignment camera acquiring an image of a second feature point, and determining second coordinates of the intermediate carrier substrate carrying stage in the word coordinate system by using the first mapping relationship and coordinates of the second feature point in the first image pixel coordinate system; and obtaining the first template calibration coordinates of the intermediate carrier substrate in the world coordinate system based on the first coordinates and the second coordinates.

11. The multi-coordinate system calibration and equipment alignment method according to claim 10, wherein the step of aligning the intermediate carrier substrate based on actual coordinates of the intermediate carrier substrate carrying stage and the first template calibration coordinates during a mass transfer process includes:

placing the intermediate carrier substrate on the intermediate carrier substrate carrying stage;

running the intermediate carrier substrate carrying stage to a position of the first coordinates, acquiring an image of a fifth feature point, and obtaining first position deviation coordinates of the image of the fifth feature point and the image of the first feature point;

running the intermediate carrier substrate carrying stage to a position of a sum of the second coordinates and the first position deviation coordinates, the first fine alignment camera acquiring an image of a sixth feature point, and obtaining second position deviation coordinates of the image of the sixth feature point and the image of the second feature point; and running the intermediate carrier substrate carrying stage to a position of the second position deviation coordinates, so that the alignment of the intermediate carrier substrate is completed.

12. The multi-coordinate system calibration and equipment alignment method according to claim 8, wherein the step of obtaining the second template calibration coordinates of the backplane in the world coordinate system by using the second mapping relationship and the galvanometer start point coordinates includes:

placing the backplane on the backplane carrying stage, wherein the backplane is provided with a plurality of pads that are arranged in an array;

running the backplane carrying stage directly below a field of view of the second rough alignment camera, acquiring an image of a third feature point, and determining third coordinates of the backplane carrying stage in the world coordinate system by using the second mapping relationship and coordinates of the third feature point in the second image pixel coordinate system;

running the backplane carrying stage directly below the field of view of the second fine alignment camera, acquiring an image of a fourth feature point, and determining fourth coordinates of the backplane carrying stage in the world coordinate system by using the second mapping relationship and coordinates of the fourth feature point in the second image pixel coordinate system;

running the backplane carrying stage to a position where coordinates of a pad at a start point of the backplane coincide with the galvanometer start point coordinates, and recording fifth coordinates of the backplane carrying stage in the world coordinate system; and obtaining the second template calibration coordinates of the backplane in the world coordinate system based on the third coordinates, the fourth coordinates and the fifth coordinates.

13. The multi-coordinate system calibration and equipment alignment method according to claim 12, wherein the step of aligning the backplane based on the actual coordinates of the backplane carrying stage and the second template calibration coordinates during the mass transfer process includes:

placing the backplane on the backplane carrying stage;

running the backplane carrying stage to a position of the third coordinates, acquiring an image of a seventh feature point, and obtaining third position deviation coordinates of the image of the seventh feature point and the image of the third feature point;

running the backplane carrying stage to a position of a sum of the fourth coordinates and the third position deviation coordinates, the second fine alignment camera acquiring an image of an eighth feature point, and obtaining fourth position deviation coordinates of the image of the eighth feature point and the image of the fourth feature point; and running the backplane carrying stage to a position of a sum of the fifth coordinates and the fourth position deviation coordinates, so that the alignment of the backplane is completed.

14. The multi-coordinate system calibration and equipment alignment method according to claim 12, wherein the intermediate carrier substrate is provided with a plurality of light-emitting diodes; in a first direction, under a standard size, a ratio of a number of the light-emitting diodes on the intermediate carrier substrate to a number of the pads on the backplane is T:1; wherein the standard size is a size occupied by a row of light-emitting diodes arranged in the first direction, and T is a positive integer greater than or equal to 1.

15. The multi-coordinate system calibration and equipment alignment method according to claim 14, wherein when T is equal to 1, the step of aligning the backplane based on the actual coordinates of the backplane carrying stage and the second template calibration coordinates during the mass transfer process includes: aligning the backplane after an intermediate carrier substrate in a first row and an nth column is aligned, n being a positive integer greater than or equal to 2, including:

after an intermediate carrier substrate in the first row and an (n−1)th column is transferred, recording a number of transferred light-emitting diodes, and obtaining fifth position deviation coordinates of coordinates of a position of a start point of the intermediate carrier substrate in the first row and the nth column and a position of a start point of the intermediate carrier substrate in the first row and the (n−1)th column;

running the backplane carrying stage to a position of a sum of the fourth coordinates, the third position deviation coordinates and the fifth position deviation coordinates, the second fine alignment camera acquiring an image of an eighth feature point, and obtaining fourth position deviation coordinates of the image of the eighth feature point and the image of the fourth feature point; and running the backplane carrying stage to a position of a sum of the fifth coordinates and the fourth position deviation coordinates, so that the alignment of the backplane is completed.

16. The multi-coordinate system calibration and equipment alignment method according to claim 14, wherein when T is greater than 1, the step of aligning the backplane based on the actual coordinates of the backplane carrying stage and the second template calibration coordinates during the mass transfer process includes: aligning the backplane after an intermediate carrier substrate in a first row and an nth column is aligned, n being a positive integer greater than or equal to 2, including:

after an intermediate carrier substrate in the first row and an (n−1)th column is transferred, recording a number of transferred light-emitting diodes, obtaining fifth position deviation coordinates of a position of a start point of the intermediate carrier substrate in the first row and the nth column and a position of a start point of the intermediate carrier substrate in the first row and the (n−1)th column, and obtaining sixth position deviation coordinates of a start position of a to-be-transferred column of light-emitting diodes of the intermediate carrier substrate in the first row and the nth column and a start position of a transferred column of light-emitting diodes;

running the backplane carrying stage to a position of a sum of the fourth coordinates, the third position deviation coordinates and the fifth position deviation coordinates, the second fine alignment camera acquiring an image of an eighth feature point, and obtaining fourth position deviation coordinates of the image of the eighth feature point and the image of the fourth feature point; and running the backplane carrying stage to a position of a sum of the fifth coordinates, the fourth position deviation coordinates and the sixth position deviation coordinates, so that the alignment of the backplane is completed.

17. The multi-coordinate system calibration and equipment alignment method according to claim 14, wherein when T is equal to 1, the step of aligning the backplane based on the actual coordinates of the backplane carrying stage and the second template calibration coordinates during the mass transfer process includes: aligning the backplane after an intermediate carrier substrate in an mth row and a first column is aligned, m being a positive integer greater than or equal to 2, including:

after an intermediate carrier substrate in an (m−1)th row and the first column is transferred, recording a number of transferred light-emitting diodes, and obtaining seventh position deviation coordinates of a position of a start point of the intermediate carrier substrate in the mth row and the first column and a position of a start point of the intermediate carrier substrate in the (m−1) the row and the first column;

running the backplane carrying stage to a position of a sum of the fourth coordinates, the third position deviation coordinates and the seventh position deviation coordinates, the second fine alignment camera acquiring an image of an eighth feature point, and determining fourth position deviation coordinates of the image of the eighth feature point and the image of the fourth feature point; and running the backplane carrying stage to a position of a sum of the fifth coordinates and the fourth position deviation coordinates, so that the alignment of backplane is completed.

18. The multi-coordinate system calibration and equipment alignment method according to claim 14, wherein when T is greater than 1, the step of aligning the backplane based on the actual coordinates of the backplane carrying stage and the second template calibration coordinates during the mass transfer process includes: aligning the backplane after an intermediate carrier substrate in an mth row and a first column is aligned, m being a positive integer greater than or equal to 2, including:

after an intermediate carrier substrate in an (m−1)th row and the first column is transferred, recording a number of transferred light-emitting diodes, obtaining seventh position deviation coordinates of a position of a start point of the intermediate carrier substrate in the mth row and the first column and a position of a start point of the intermediate carrier substrate in the (m−1) the row and the first column, and obtaining sixth position deviation coordinates of a start position of a to-be-transferred column of light-emitting diodes of the intermediate carrier substrate in the mth row and the first column and a start position of a transferred column of light-emitting diodes;

running the backplane carrying stage to a position of a sum of the fourth coordinates, the third position deviation coordinates and the fifth position deviation coordinates, the second fine alignment camera acquiring an image of an eighth feature point, and obtaining fourth position deviation coordinates of the image of the eighth feature point and the image of the fourth feature point; and running the backplane carrying stage to a position of a sum of the fifth coordinates, the fourth position deviation coordinates and the sixth position deviation coordinates, so that the alignment of the backplane is completed.

19. A non-transitory computer-readable storage medium, wherein the non-transitory computer-readable storage medium has stored computer instructions, the computer instructions are used to cause a computer to perform the multi-coordinate system calibration and equipment alignment method according to claim 1.

20. A mass transfer equipment, comprising a memory, an intermediate carrier substrate, an intermediate carrier substrate carrying stage, a camera of the an intermediate carrier substrate carrying stage, a backplane, a backplane carrying stage, a camera of the backplane carrying stage, a laser, a processor, and a computer program stored in the memory and executable on the processor, wherein the processor executes the program to implement the multi-coordinate system calibration and equipment alignment method according to claim 1.

* * * * *